(12) United States Patent
Sasaki et al.

(10) Patent No.: US 7,759,254 B2
(45) Date of Patent: Jul. 20, 2010

(54) METHOD FOR FORMING IMPURITY-INTRODUCED LAYER, METHOD FOR CLEANING OBJECT TO BE PROCESSED APPARATUS FOR INTRODUCING IMPURITY AND METHOD FOR PRODUCING DEVICE

(75) Inventors: Yuichiro Sasaki, Tokyo (JP); Katsumi Okashita, Tokyo (JP); Bunji Mizuno, Nara (JP); Hiroyuki Ito, Chiba (JP); Cheng-Guo Jin, Kanagawa (JP); Hideki Tamura, Kanagawa (JP); Ichiro Nakayama, Osaka (JP); Tomohiro Okumura, Osaka (JP); Satoshi Maeshima, Hyogo (JP)

(73) Assignee: Panasonic Corporation, Osaka (JP)

( * ) Notice: Subject to any disclaimer, the term of this patent is extended or adjusted under 35 U.S.C. 154(b) by 661 days.

(21) Appl. No.: 10/569,464

(22) PCT Filed: Aug. 25, 2004

(86) PCT No.: PCT/JP2004/012583

§ 371 (c)(1), (2), (4) Date: Mar. 3, 2006

(87) PCT Pub. No.: WO2005/024198

PCT Pub. Date: Mar. 17, 2005

(65) Prior Publication Data
US 2006/0264051 A1    Nov. 23, 2006

(30) Foreign Application Priority Data
Aug. 25, 2003  (JP) .......................... 2003-299596

(51) Int. Cl.
*H01L 21/302* (2006.01)
(52) U.S. Cl. .................... 438/717; 438/480; 438/745; 438/766

(58) Field of Classification Search ................ 438/158, 438/162, 479, 712, 745, 480, 706, 717, 766; 134/1.1, 1.2
See application file for complete search history.

(56) References Cited

U.S. PATENT DOCUMENTS 5,561,072 A    10/1996   Saito
(Continued)

FOREIGN PATENT DOCUMENTS

JP    58-97863    6/1983
(Continued)

OTHER PUBLICATIONS

A. Yoshida et al., "Formation of Source and Drain Regions for a-Si:H Thin-Film Transistors by Low-Energy Ion Doping Technique," IEEE Electron Device Letters, vol. 9, No. 2, Feb. 1988, pp. 90-93.
(Continued)

*Primary Examiner*—Lan Vinh
(74) *Attorney, Agent, or Firm*—McDermott Will & Emery LLP

(57) ABSTRACT

A method of forming an impurity-introduced layer is disclosed. The method includes at least a step of forming a resist pattern on a principal face of a solid substrate such as a silicon substrate (S27); a step of introducing impurity into the solid substrate through plasma-doping in ion mode (S23), a step of removing a resist (S28), a step of cleaning metal contamination and particles attached to a surface of the solid substrate (S25a); a step of anneal (S26). The step of removing a resist (S28) irradiates the resist with oxygen-plasma or brings mixed solution of sulfuric acid and hydrogen peroxide water, or mixed solution of $NH_4OH$, $H_2O_2$ and $H_2O$ into contact with the resist. The step of cleaning (S25a) brings mixed solution of sulfuric acid and hydrogen peroxide water, or mixed solution of $NH_4OH$, $H_2O_2$ and $H_2O$ into contact with the principal face of the solid substrate. The step of removing a resist (S28) and the step of cleaning (S25a) can be conducted simultaneously by bringing mixed solution of sulfuric acid and hydrogen peroxide water, or mixed solution of $NH_4OH$, $H_2O_2$ and $H_2O$ into contact with the principal face of the solid substrate.

24 Claims, 18 Drawing Sheets

U.S. PATENT DOCUMENTS

| | | | |
|---|---|---|---|
| 5,892,235 | A | 4/1999 | Yamazaki et al. |
| 5,897,346 | A | 4/1999 | Yamaguchi et al. |
| 5,956,581 | A | 9/1999 | Yamazaki et al. |
| 5,969,398 | A | 10/1999 | Murakami |
| 6,025,252 | A | 2/2000 | Shindo et al. |
| 6,051,482 | A | 4/2000 | Yang |
| 6,174,757 | B1 * | 1/2001 | Yamaguchi et al. ......... 438/166 |
| 6,436,747 | B1 | 8/2002 | Segawa et al. |
| 6,465,727 | B2 | 10/2002 | Maruyama et al. |
| 6,610,168 | B1 * | 8/2003 | Miki et al. ................. 156/344 |
| 6,653,699 | B1 | 11/2003 | Yang |
| 6,713,819 | B1 | 3/2004 | En et al. |
| 2002/0155679 | A1 | 10/2002 | Ogura et al. |
| 2002/0177289 | A1 | 11/2002 | Kase et al. |
| 2003/0022473 | A1 | 1/2003 | Matsumoto et al. |
| 2003/0132450 | A1 | 7/2003 | Minato et al. |
| 2003/0157754 | A1 * | 8/2003 | Yamazaki et al. ........... 438/162 |
| 2003/0199129 | A1 * | 10/2003 | Yamazaki et al. ........... 438/158 |
| 2003/0211670 | A1 | 11/2003 | Downey |
| 2003/0232465 | A1 * | 12/2003 | Hayakawa ................. 438/151 |
| 2004/0251398 | A1 * | 12/2004 | Mouli et al. ............. 250/214.1 |
| 2005/0227463 | A1 | 10/2005 | Ito et al. |
| 2006/0068569 | A1 * | 3/2006 | Miyanaga et al. ........... 438/478 |
| 2006/0091387 | A1 * | 5/2006 | Yamazaki .................... 257/59 |
| 2006/0205192 | A1 | 9/2006 | Walther et al. |
| 2006/0264051 | A1 | 11/2006 | Thibault |

FOREIGN PATENT DOCUMENTS

| | | |
|---|---|---|
| JP | 02-295114 | 12/1990 |
| JP | 03-255622 | 11/1991 |
| JP | 5-206045 | 8/1993 |
| JP | 5-206053 | 8/1993 |
| JP | 05-314944 | 11/1993 |
| JP | 06-168956 | 6/1994 |
| JP | 6-310533 | 11/1994 |
| JP | 08-213339 | 8/1996 |
| JP | 9-17867 | 1/1997 |
| JP | 09-092804 | 4/1997 |
| JP | 09-199719 | 7/1997 |
| JP | 11-031665 | 2/1999 |
| JP | 11-274492 | 10/1999 |
| JP | 11-340424 | 12/1999 |
| JP | 2000-195814 | 7/2000 |
| JP | 2000-349039 | 12/2000 |
| JP | 2001-007220 | 1/2001 |
| JP | 2003-077856 | 3/2003 |
| JP | 2003-528462 | 9/2003 |
| WO | WO 98/34268 | 8/1998 |
| WO | WO 02/067333 A1 | 8/2002 |

OTHER PUBLICATIONS

F. Kroner et al., "Phosphorous Ion Shower Implantation for Special Power IC Applications," IEEE, pp. 476-479, 2000.

P.G. Carey et al., "Fabrication of Submicrometer MOSFET's Using Gas Immersion Laser Doping (GILD)," IEEE Electron Device Letters, vol. 7, No. 7, Jul. 1986, pp. 440-442.

Sameshima et al., "In Situ Observation of Pulsed Laser Doping," Japanese Journal of Applied Physics, vol. 27, No. 10, Oct. 1988, pp. L1935-L1937.

Ito et al "Improvement of Threshold Voltage Roll-Off by Ultra-shallow Junction Formed by Flash Lamp Annealing", 2003 pp. 53-54.

Talwar, S., et al., "Study of Laser Thermal Processing (LTP) to Meet Sub 130 nm Node Shallow Junction Requirements," 2000, p. 175-177, 0/7803-6462-7/00, IEEE.

Ito, T., et al., "Flash Lamp Annealing Technology for Ultra-shallow Junction Formation," Extended Abstracts of International Workshop on Junction Technology 2002, 2002, p. 23-26, S3-1 (Invited) ISBN: 4-89114-028-3/029-1, Japan Society of Applied Physics, Japan.

Yamamoto, T., et al., "Impact of Pre-Amorphization for the Reduction of Contact Resistance Using Laser Thermal Process," Extended Abstracts of International Workshop on Junction Technology 2002, 2002, p. 27-30, S3-2, ISBN: 4-89114-028-3/029-1, Japan Society of Applied Phyiscs, Japan.

Kagawa, K., et al., "Influence of pulse duration on KrF excimer laser annealing process for ultra shallow junction formation," Extended Abstracts of International Workshop on Junction Technology 2002, 2002, p. 31-34, S3-3, ISBN: 4-89114-028-3/029-1, Japan Society of Applied Physics, Japan.

Yamashita, F., et al., "Direct Joule Heating of Nd-Fe-B Based Melt-Spun Powder and Zinc Binder", 1999, IEEE.

Chu, P.K., et al., "Part one of two, Plasma Doping: Progress and potential", Solid State Technology, Sep. 1999, pp. 55-60, www.solid-state.com.

Chu, P.K., et al., "Part two of two, Plasma Doping: Progress and potential", Solid State Technology, Oct. 1999, pp. 77-82, www.solid-state.com.

Hori, A., et al., "CMOS Device Technology toward 50 nm Region—Performance and Drain Architecture—", IEDM, 1999, pp. 641-644, IEEE.

Kwok, Dixon T.K., et al., "Energy distribution and depth profile in $BF_3$ plasma doping", Surface and Coatings Technology, 2001, pp. 146-150, vol. 136, Elsevier Science B.V.

Yamashita, F., et al., "Nd-Fe-B Thin Arc-shaped Bonded Magnets for Small DC Motors Prepared by Powder Compacting Press with Ion-implanted Punches", J. Mgn. Soc. Japan, 2001, pp. 683-686, vol. 25 No. 4-2.

Yamashita, F., et al., "Preparation of a Solid Rotor Composed of a Highly Dense Ring-Shaped RE Bonded Magnet and an Iron-Dust Core", Trans. Magn. Soc. Japan., 2002, pp. 111-114, vol. 2 No. 3.

Mizuni, B., "Ultra Shallow Junction for sub-50NM CMOS—The role of Plasma Doping-", UJTLab, pp. 10-13, Ultimate Junction Technologies Inc.

Sasaki, Y., et al., "$B_2H_6$ Plasma Doping with In-situ He Pre-amorphization", Symposium on VLSI Technology Digest of Technical Papers, 2004, pp. 180-181, IEEE.

Sasaki, Y., et al., "Plasma Doped Shallow Junction Formation", Matsushita Technical Journal, Dec. 2004, pp. 404-409, vol. 50 No. 6.

Tsutsui, K., et al., "Doping Effects from Neutral $B_2H_6$ Gas Phase on Plasma Pretreated Si Substrates as a Possible Process in Plasma Doping", The Japan Society of Applied Physics, 2005, pp. 3903-0907, vol. 44 No. 6A.

Mizuno, B., et al., "De-Excitation Pathways of highly-Excited Self-Trapped Exciton and Electron Plus Self-Trapped Hole", Journal of the Physical Society of Japan, Jun. 1983, pp. 1901-1903, vol. 52 No. 6.

Mizuno, B., "Excitation-Induced Atomic Motion of Self-Trapped Excitons in RbCl: Reorientation and Defect Formation", Journal of the Physical Society of Japan, Sep. 1986, pp. 3258-3271, vol. 55 No. 9.

Mizuno. B., et al., "Effect of Hydrogen on Oxygen Removal from Silicon-Overlayer on Insulator formed by $O^+$ Implantation", pp. 637-640, Semiconductor Research Center, Matsushita Electric Industrial Co., Ltd.

Fujita, T., et al., "Electron Paramagnetic Resonance Studies of Defects in Oxygen-Implanted Silicon", Jaanese Journal of Applied Physics, Jul. 1987, pp. L1116-L1118, vol. 26 No. 7.

Mizuno, B., et al., "Effective removal of oxygen from Si layer on burned oxide by implantation of hydrogen", J. Appl. Phys., Sep. 1987, pp. 2566-2568, vol. 62 No. 6.

Mizuno, B., et al., "New doping method for subhalf micron trench sidewalls by using an electron cyclotron resonance plasma", Appl. Phys. Lett., Nov. 1988, pp. 2059-2061, vol. 53 No. 21, American Institute of Physics.

Shimizu, N., et al., "Reduction of Thickness Secondary Defects in MeV ion Impalted Silicon by Intrinsic Gettering", Extended Abstracts of the 21st Conference on Solid State Devices and Materials, Tokyo, 1989, pp. 177-180.

Hori, A., et al., "A 0.05 μm-CMOS with Ultra Shallow Source/Drain Junctions Fabricated by 5KeV Ion Implantation and Rapid Thermal Annealing", 1994, pp. 485-488, IEDM.

Hori, A., et al., "Fabrication and Characteristics of a Room Temeprature 0.05 µm-CMOS—Possibility and Design Concept of Sub-0.1 µm MOS Devices-", Technical Report of IEICE, 1995, pp. 41-46, The Institute of Electronics, Information and Communication Engineers.

Mizuno, B., et al. "Plasma doping for silicon", Surface and Coatings Technology, 1996, pp. 51-55, vol. 85, Elsevier Science S.A.

Mizuno, B., et al., "Plasma Doping of Boron for Fabricating the Surface Channel Sub-quarter micron PMOSFET", Symposium on VLSI Technology Digest of Technical Digest of Technical Papers, 1996, IEEE.

Takase, M., et al., "An evaluation method for a high concentration profile produced in very low energy doping processes", Nuclear Instruments and Methods in Physics Research, 1997, pp. 288-290, vol. 121, Elsevier Science B.V.

Takase, M., et al., "Suppressing Ion Implantation Induced Oxide Charging by Utilizing Physically Damaged Oxide Region", Jpn. J. Appl. Phys., Mar. 1997, pp. 1618-1621, vol. 36 Part 1, No. 3B.

Mizuno. B., et al., "Plasma Doping", pp. 165-170, Central Research Laboratory, Matsushita Electric Industrial Co., Ltd.

Kadokura, M., et al., "Analysis and Design of At-Cut Quartz Resonators by three dimensional finite element method", EEP-vol. 19-1, Advances in Electronic Packaging, 1997, pp. 1101-1108, vol. 1, ASME 1997.

Mizuno. B., et al., "Plasma Doping and Plasma-Less Doping of Semiconductor", Mat. Res. Soc. Symp. Proc., 1997, pp. 345-950, vol. 438, Materials Research Society.

Takase, M., et al, "New Doping Technology-Plasma Doping—for Next Generation CMOS process with Ultra Shallow Junction—LSI Yield and surface contamination issues -", 1997, pabes B9-B12, IEEE.

Takase, M., et al., "Shallow Source/Drain Extensions for pMOSFETs with High Activation and Low Process Damage Fabricated by Plasma Doping", IEDM, 1997, pp. 475-478, IEEE.

Jin, C.G., "Hard X-ray Photoelectron spectroscopy (HX-PES) study on chemical binding states of ultra shallow plasma-doped silicon layer for the application of advanced ULSI devices", 2006, pp. 116-119, IEEE.

Mizuno, B., et al., "Plasma Doping and Subsequent Rapid Thermal Processing for Ultra Shallow Junction Formation", 13th IEEE International Conference on Advanced Thermal Processing of Semiconductors—RTP, 2005, IEEE.

Mizuno, B., et al., "Plasma Doping", 2004, pp. 423-427, IEEE.

Sasaki, Y., et al., "Gas Phase Doping at Room Temperature", Extended Abstract of International Workshop on Junction Technology, 2002, pp. 39-40, Japan Society of Applied Physics.

Sasaki, Y., et al., "Helicon Wave Plasma Doping System", Extended Abstract of International Workshop on Junction Technology, 2002, pp. 37-38, Japan Society of Applied Physics.

Jin, C.G., et al., "Estimation of Ultra-Shallow Plasma Doping (PD) Layer's Optical Absorption Properties by Spectroscopic Ellipsometry (SE)", 2004, pp. 102-103, IEEE.

Shimizu, N., et al., "Secondary Defect Reduction by Multiple MeV Boron Ion Implantation", Extended Abstract of the 22nd (1990 International) Conference on solid State Devices and Materials, Sendai, 1990, pp. 449-452.

Sasaki, Y., et al., "New method of Plasma doping with in-situ Helium pre-amorphization", Nuclear Instruments and Methods in Physics Research B 237, 2005, pp. 41-45, Elsevier B.V.

Jin, C.G., "Ultra shallow p$^+$/n junction formation by plasma doping (PD) and long pulse all solid-state laser annealing (ASLA) with selective absorption modulation", Nuclear Instruments and Methods in Physics Research B 237, 2005, pp. 58-61, Elsevier B.V.

Mizuno, B., et al., "Plasma Doping and Plasma-Less Doping for SI: Application to the sub-quarter micron Surface Channel PMOSFET and Solid Plasma Source Application for Safety Operation", Semiconductor Research Center, Matsushita Electric Industrial Co., Ltd.

Liu, H., et al., "A New Plasma-Aided Solid-Source Implantation Method for Ultra-Shallow p+/n Junction Fabrication", Engineering Research Center for Plasma-Aided Manufacturing, University of Wisconsin-Madison.

Mizuno, B., "Plasma Doping into the Side-Wall of a Sub-0.5 µm Width Trench", Extended Abstracts of the 19th Conference on Solid State Devices and Materials, Tokyo, 1987, pp. 319-322.

Mizuno, B., "Plasma Doping Technology", Applied Physics, 2001, pp. 1458-1462, vol. 70.

Takase, M., et al., "Shallow Source/Drain Extensions for pMOSFETs with High Activation and Low Process Damage Fabricated by Plasma Doping", Technical Report of IEICE, 1998, The Institute of Electronics, Information and Communication Engineers.

Mizuno, et al., "Ultralow Energy Doping Plasma Doping", Special Issue—Currently Developed Ion Engineering Technology-1.

Mizuno, B., et al., "Plasma Based Ion Implantation—Plasma Doping", High Temperature Science Journal, May 1996, pp. 114-120, vol. 3 No. 22.

Tatsumi, T., et al., "Multilevel Interconnection Technology using Fluorinated Amorphous Carbon films", 3p-ZX-3 Silicon Systems Research Laboratories, NEC Corporation.

Mizuno. B., et al., Plasma doping for fabricating ultra shallow junction, 3p-ZX-4, Matsushita Electric Industrial Co., Ltd.

Oda, H., et al., "Demand for Junction Technology in CMOS Transistors", 27a-ZL-1, 49th Applied Physics Lecture Series—Lecture Manuscripts, Comprehensive Lectures within the Area, 2002, Tokai University.

Mizuno, B., et al., "Junction Technologies: Status Quo and Perspectives", 27a-ZL-2, Comprehensive Lectures within the Area.

Hata, N., et al., "Characterization of Low-k Dielectrics by Z-ray Scattering-Anisotropy in Pore Diameter and its Suppression", 26p-M-19, 63rd Applied Physics Lecture Series—Lecture Manuscripts, 2002, Niigaka University.

Shimanuki, J., et al., "Behavior of pores in a thin low-k film during anneal—Ex-situ TEM observation method", 26p-M-20.

Sasaki, Y., et al., "In-Situ Beam Current Monitor for Ion Implanter", 25a-G-1, pp. 768.

Higaki, R., et al., "Plasma Doping and Plasma Assisted Gas Doping", 25a-G-2, 63rd Applied Physics Lecture Series—Lecture Manuscripts, 2002, Niigaka University.

Kurosawa, J., et al., "Development of Ni-B-P-Pt type liquid metal ion source for formation of Ni-nano dopant array by single ion implantation", 25a-G-3, 63rd Applied Physics Lecture Series—Lecture Manuscripts, 2002, Niigaka University.

Imamura, K., et al., "Development of key-techniques for co-doping of acceptor and donor by single ion implantation", 25a-G-4, 63rd Applied Physics Lecture Series—Lecture Manuscripts, 2002, Niigaka University.

Yamashita, K., et al., "Development of Flash Lamp Annealer for 300mm Wafers", 29p-ZW-10, 50th Applied Physiscs Lecture Series—Lecture Manuscripts, 2003, Shinagawa University.

Kubo, Y., et al., "Development of advance single ion implantor", 29p-ZW-11, 50th Applied Physiscs Lecture Series—Lecture Manuscripts, 2003, Shinagawa University.

Higaki, R., et al., "Dose Control of gas Phase Doping at Room Temperature" 29p-ZW-12, 50th Applied Physiscs Lecture Series—Lecture Manuscripts, 2003, Shinagawa University.

Akama, S., et al., "The Surface Reaction mechanism of Gas Phase Doping at Room Temperature", 29p-ZW-13, 50th Applied Physiscs Lecture Series—Lecture Manuscripts, 2003, Shinagawa University.

Sasaki, Y., et al., "Behavior of H and contamination in the Plasma Doping (PD) process", 29p-ZW-14, 50th Applied Physiscs Lecture Series—Lecture Manuscripts, 2003, Shinagawa University.

Kurobe, K., et al., "Ultra-shallow n+/p Junction Formation by Heat-assisted Excimer Laser Annealing", 29p-ZW-15, 50th Applied Physiscs Lecture Series—Lecture Manuscripts, 2003, Shinagawa University.

Fujinami, M., et al., "Research in Pores and Oxygen Compound Deficits in Si Due to the Positron Annihilation Coincidence Doppler Broadening Method, Positron Annihilation Coincidence Doppler Broadening Methods for Vacancy-Oxygen Complexes in Si", 1a-A-8, 64th Applied Physics Lecture Series—Lecture Manuscripts, 2003, Fukuoka University.

Miyagoe, T., et al., "Behavior Research on Deficits in Noble Gas Ion Implanted Si Using a Positron Beam, Positron beam study of defects induced by noble gas implanted Si", 1a-A-9, 64th Applied Physics Lecture Series—Lecture Manuscripts, 2003, Fukuoka University.

Higaki, R., et al., "Effects on the Substrate Surface conditions with Gas Doping Having Used Plasma Preprocessing, Effects of substrate surface condition on gas-phase doping using plasma pretreatment", 1a-A-10, 64th Applied Physics Lecture Series—Lecture Manuscripts, 2003, Fukuoka University.

Itoh, H., et al., "Ultra-low energy ion implantation in Si II", 30p-ZQ-9, Preprints of the 67th Meeting of the Japan Society of Applied Physics, 2006, Ritsumeikan University.

Matsuda, T., et al., "Spike RTA Induced Changes in Chemical Bondings and Their Depth Profile of Plasma-doped Boron", 30p-ZQ-10, Preprints of the 67th Meeting of the Japan Society of Applied Physics, 2006, Ritsumeikan University.

Tanaka, Y., et al., "8nm (5E18cm$^{-2}$) Ultra Shallow Junction Formation by Double-Pulsed Green Laser Annealing", 30p-ZQ-11, Preprints of the 67th Meeting of the Japan Society of Applied Physics, 2006, Ritsumeikan University.

Haya, A., et al., "Surface Modification of Plastic Substrate by Atomic Hydrogen Anneal and Effect of AHA to Film Deposition", 29p-SM-1, Preprints of the 54th Meeting of the Japan Society of Applied Physics and Related Societies, 2007, Aoyama Gakuin University.

Ohashi, Y., et al., "Effects of Hydrogenation on Chemical Activity of Defects in Polycrystalline Silicon Thin films", 29p-SM-2, Preprints of the 54th Meeting of the Japan Society of Applied Physics and Related Societies, 2007, Aoyama Gakuin University.

Watanabe, M., et al., "Study of Activated Boron Depth Profiles and Ultra-Shallow P+ Layers Formed by Plasma Doping Method", 29p-SM-3, Preprints of the 54th Meeting of the Japan Society of Applied Physics and Related Societies, 2007, Aoyama Gakuin University.

Ishiba, T., et al., "Lattice Strains in High Energy Ion Implated Silicon Subjected to Thermal Annealings", 27a-SN-13.

Shimizu, N., et al., "Secondary Defect Reduction of Multiple MeV Ion Implatation (II)", 27a-SN-14.

Nakata, J., "The Low-Temperature Crystallization and Amorphization Mechanism of Amorphous Si by High Energy Heavy-Ion Beam Irradiation", 27a-SN-15.

Matsumoto, M., "The Influence of Pre-oxidation Cleaning on Grotwh of Oxide Film (II)", 28a-D-1.

Uchida, H., et al., "Influence of Cleaning methods on Dielectric Breakdown in Thin Sio$_2$," 28a-D-2.

Takiyama, M., et al., "Electrical Characteristics of Al MOS Diode Contaminated with Cu-I", 28a-D-3.

Shimizu, N., et al., "Secondary Defect Reduction of Multiple MeV Ion Implantation (III)", 31a-X-5.

Kimoto, K., et al., "Rapid Thermal Annealing for High-energy Ion Implanted Si (V)" 31a-X-6.

Koyama, Y., et al., "Rapid Thermal Annealing for High-energy Ion Implanted Si (VI)" 31a-X-7.

Suzuki, H., et al., "Preamorphization by si Double Ion Implantation", 9p-C-12.

Takamatsu, H., et al., "Evaluation of Anneal Effect by Photoacoustic Displacement Measurement", 9p-C-13.

Shimizu, N., et al., "Effects of Junction Leakage Current Reduction of Additional High Energy Si Ion Implantation", 9p-C-14.

Katsumoto, M., et al., "The Effect of NH4OH/H202 Cleaning on C-V Characteristics of MOS Capacitor", 11p-B-12.

Shinno, H., "Ellipsometric Measurements of Silicon Surfaces During Oxidation in R.F. Plasma", 11p-B-13.

Maekawa, M., et al., "Effect of H2SO4 Boiling on Silicon Surface", 11p-B-14.

Mizuno, B., et al., "Plasma-assisted Impurity Doping for ULSIs", 28p-ZP-10.

Itatani, R., "Introductory Talk, Matrial Processing Induced by Electron Beam", 28p-ZQ-1.

Tanimura, S., et al., D-255 Total Management System for VLSI Manufacturing, 1994 Spring Conference of the Institute of Electronics, Information and Communications Engineers, Matsushita Electric Industrial Co., Ltd.

Maekawa, T., et al., "Annealing of Ar$^+$ Implanted Damage" 30p-ZK-2.

Okahisa, M., et al., "Electrical Properties of High Energy Boron-implanted Layers in Si", 30p-ZK-3.

Shimizu, N., et al., "Effects of n+ Layer Formation on Junction Leakage Current Using High Energy Ion Implantation", 30p-ZK-4.

Kinoshita, K., et al., "Optical Property Change of Silicon in Low Energy Ion Implantation (II)", 28a-ZW-8.

Mizuno, B., et al., "A Sputtering Effect During the Ion Implantation with Low Energy", 28a-ZW-9.

Kagawa, K., et al., "Effect of Charging During Ion Implantation on Devices", 28a-ZW-10.

Murakoshi, A., et al., "Formation of Ultra Shallow Diffusion Layer by Ultra Low Energy Ion Implantation", 26p-ZN-10.

Mizuno, B., et al., "Plasma Doping Method", 26p-ZN-11.

Fukuda, K., et al., "Fabrication of Ultra Shallow Junction by Spin-on Glass SiO$_2$ Film" 26p-ZN-12.

Ishii, M., "Quantitative Analysis of rare-Gas Ion Bombardment Damage of Si Surface using XPS", 26p-ZP-6.

Takase, M., et al., "Evaluation Method of Hifh concentration Profile for Low Energy Ion Implantation", 26p-ZP-7.

Nakamura, T., et al., "Influence of simultaneously Implanted As+ ions on diffusivity and activation efficency of B atoms implanted into silicon", 26p-ZP-8.

Akiyama, H., et al., "The life-time control technique for power devices using high-energy heavy ion radiation", 28a-P-6.

Takase, M., et al., "The Indentification of the Region of Ion Implantation Induced Physical Damaged Layer", 28a-P-7.

Tamura, F., et al., "Measurement of the minority carrier lifetime for the Si epitaxial layer", 28a-P-8.

Mizuno, B., et al., "Room Temperature Vapor Phase Doping (RTVD)", 28p-P-4.

Mizuno, B., et al., "Plasma Doping Applicable to sub-1/4 micron PMOS", 28p-P-5.

Kujirai, H., et al., "Ultra-shallow, low resistance junction formation by solid-phase diffusion of boron from BSG", 28p-P-6.

Takase, M., et al., "Dosage Control by Plasma Emission in Plasma Doping Process", 7a-P-2.

Murakami, E., et al., "Formation of Ultrashallow Junctions by Sb Selective δ Doping Technique", 7a-P-3.

Kiyota, Y., et al., the Role of Hydrogen during Rapid Vapor-phase Doping Analyzed by FTIR-ATR, 7a-P-4.

Takase, M., et al., "Fabrication of Low Sheet Resistance and Shallow Source/Drain Junction with Plasma Doping Process", 29a-G-2.

Shimada, N., et al., "Shallow Junction, Formation by Polyatomic Cluster Ion Implantation", 29a-G-3.

Ishikawa, T., et al., "Formation of shallow junctions by low-energy implantation", 29a-G-4.

Shimada, N., et al., "Shallow Junction Formation by Decaborane Ion Impantation (IV)", 3a-PC-13.

Mineji, A., et al., "Shallow Junction Formation by 0.2 keV-single B Ion Implantation", 3a-PC-14.

Takase, M., et al., "High Activation Ultra Shallow Source/Drain Junction Fabricated by Plasma Doping", 3a-PC-15.

Nishida, S., et al., "the Herzog correction revisited", 7a-YP-8.

Ono, S., et al., "Design of a cryogenic current measuring device using a SQUID for low-intensity beams", 7a-YP-9.

Haruyama, Y., et al., "High resolution measurement of HeH$^+$ dissociative recombination with superconductor electron cooler", 7a-YP-10.

Tsurubuchi, S., et al., "Excitation cross sections for the resonance states of the Ne by electron impact", 7a-YP-11.

Wakabayashi, et al., "IEDM Focusing on high speed and low electric power techniques , Finally the Cu damascene technique for practical applications has arrived", IEDM Conference, 1997, IEEE.

Nakata, K., et al., "Fail Bit map Correlation Analysis System", The Institute of Electronics, Information and Communication Engineers (IEICE) Electronics Society Annual Meeting, 1995.

Tsubo, Y., et al., "Diffusion of Phosphorus from P-doped Polysilicon through Ultrathin siO2 into Si Substrate", 30p-ZP-11.

Aoyama, T., et al., "Boron Diffusion in Silicon Dioxide in the Presence of Hydrogen and Fluorine", 30p-ZP-12.

Takase, M., et al., "Effect of oxide thickness on boron profile in the plasma doping process", 30p-ZP-13.

Mizuno, B., et al., "Plasma Doping", Invitational Lecture.

Takase, M., et al., "Plasma doping Technology for the MOS transistor with a channel length below 0.15 μm", Applied Physics, 1999, vol. 68 No. 5.

Sasaki, Y., et al., "Nondestructive Beam Current Monitor Using DC SQUID", pp. 68-76.

Kobayashi, K., et al., "Three-Dimensional Plasma Doping for Beam-Channel Transistor", 29p-ZG-13, Preprints of the 51st Spring meeting of the Japan Society of Applied Physics and Related Societies, Mar. 2004, Tokyo University of Technology.

Sato, T., et al., "Effect of wet cleaning treatment on dose of impurity after plasma doping", 29p-ZG-14, Preprints of the 51st Spring meeting of the Japan Society of Applied Physics and Related Societies, Mar. 2004, Tokyo University of Technology.

Takagi, K., et al., "Profile control by Helium plasma treatment in plasma doping method", 29p-ZG-15, Preprints of the 51st Spring meeting of the Japan Society of Applied Physics and Related Societies, Mar. 2004, Tokyo University of Technology.

Okashita, K., et al., "In-situ Plasma Pre-amorphization for Shallow Junction Formation", 3p-P10-14, Preprints of the 65th Meeting of the Japan Society of Applied Physics and Related Societies, Sep. 2004, Tohoku Gakuin University.

Nakazawa, H., et al., "Characterization of Boron/Phosphorus Layer by Cold/Heat Ion Implantation", 3p-P10-15, Preprints of the 65th Meeting of the Japan Society of Applied Physics and Related Societies, Sep. 2004, Tohoku Gakuin University.

Kobayashi, K., et al., "Doping Profile Evaluation for Three-Dimensional Transistor", 3p-P10-16, Preprints of the 65th Meeting of the Japan Society of Applied Physics and Related Societies, Sep. 2004, Tohoku Gakuin University.

Otakagi, K., et al., "Effect on Impurity profile of Helium Plasma Treatment on a Plasma Doping Method", 65th Japan Society of Applied Physics Symposium Collection of Lectures, Sep. 2004, Tohoku Graduate Department.

Sauddin, H., et al., "Leakage Current in Mesa-type p+/n, Junctions Formed by Plasma Doping", 10a-A-10, PerPreprints of the 66th Meeting of the Japan Society of Applied Physics, 2005, Tokushima University.

Fukagawa,Y., et al., "Electrical Properties of ultra-Shallow p+ Layers Formed by Plasma Doping", 10a-A-11, PerPreprints of the 66th Meeting of the Japan Society of Applied Physics, 2005, Tokushima University.

Matsuda, T., et al., "Chemical Bonds of Boron Atoms Implanted in A Silicon Surface by Plasma Doping", 10a-A-12, PerPreprints of the 66th Meeting of the Japan Society of Applied Physics, 2005, Tokushima University.

Mizuno, B., et al., "Reduction of lattice defect in Si layer on buried oxide by implantation of hydrogen,", SDM 87-169, Basic Research Lab., Semiconductor Research Center, Matsushita Electric industrial Co., Ltd.

Mizuno, B., et al., "ECR Plasma Doping", SDM 88-95, Semiconductor Research Center, Semiconductor Basic Research Lab., Matsushita Electric industrial Co., Ltd.

Mizuno, B., et al., "ECR Plasma Doping", Electronic Material, Dec. 1987.

Mizuno, B., "Plasma Doping Technology", Semiconductor Research Center, Matsushita Electric industrial Co., Ltd.

Nakada, K., et al., "D-259 Development of Cleanroom Auto Control System", 1994 Spring Conference of the Society of Electronic information and Communications.

Mizuno, B., et al., "Behavior of Implanted Ions Near the Surface—Outer Diffusion and Self-sputtering", 28p-ZL1.

Yamanishi, Y., et al., "Behavior during Oxidation of Nitrogen Introduced by Ion Implantation", 28p-ZL2.

Zaizu,Y., et al., "Effects of Silicon Nitride Films on Boron Enhanced Diffusion and Crystalline Defects due to Boron Implantation", 28p-ZL3.

Mizuno, B., et al., "Behavior near Surface of Implanted Ions (cont'd) Self-sputtering and Back-scattering", 20p-ZE-11.

Kinoshita K., et al., "Optical Changes in Association with Crystalline Damage due to Low Energy Ion Implantation (IV)", 20p-ZE-12.

Hasegawa, K., et al., "Dual Species (B, As) Implantation in Silicon", 28p-ZE-13.

Sato, T., et al., "Dose Volume changes and HF Cleansing Before and After Plasma Doping Change dose caused by HF treatment before and after plasma doping", 1a-A-11, 64th Applied Physics Lecture Series—Lecture Manuscripts, 2003, Fukuoka University.

Susuki, K., "High Tilt Angle Ion Implantation in Polycrystalline Si, High tilt angle ion implantation into Polycrystalline silicon", 1p-A-1, 64th Applied Physics Lecture Series—Lecture Manuscripts, 2003, Fukuoka University.

Yamada, M., et al., "Evaluation of Junction Leak Current Caused by Element Isolation Stress, Study of junction leakage currents induced by the stress of shallow trench isolation", 1p-A-2, 64th Applied Physics Lecture Series—Lecture Manuscripts, 2003, Fukuoka University.

Aiba, I., et al., "Dose Variation by Chemical Cleaning Process after Plasma Doping", 3p-P10-18, 65th Japan Society of Applied Physics Symposium Collection of Lectures, Sep. 2004, Tohoku Graduate Department.

Majima, M., et al., "Hall Effect Measurement of ultra Shallow $p^+n$ Junctions formed by Plasma Doping", 3p-P10-19, 65th Japan Society of Applied Physics Symposium Collection of Lectures, Sep. 2004, Tohoku Graduate Department.

Masuda, T., et al., "Amorphization of Large-scale Silicon Substrate by using hybrid Quantum Chemical Molecular Dynamics Method", 1a-YE-7, 52nd Japan Society of Applied Physics Symposium Collection of Lectures, 2005, Saitama University.

Fukugawa,Y., et al., "Examination of pre-amorphous layer formation process by He plasma irradiation", 1a-YE-8, 52nd Japan Society of Applied Physics Symposium Collection of Lectures, 2005, Saitama University.

Aiba, I., et al., "Plasma Doping on Si substrates with Resist Patterns", 1a-YE-9, 52nd Japan Society of Applied Physics Symposium Collection of Lectures, 2005, Saitama University.

Okashite, K., et al., "Ultra Shallow Junction Formation with Plasma Doping and Spike RTA", 1a-YE-10, 52nd Japan Society of Applied Physics Symposium Collection of Lectures, 2005, Saitama University.

Sauddin, H., "Leakage Current Characteristics of Ultra-shallow p+/n Junctions Formed by Plasma Doping", 1a-YE-11, 52nd Japan Society of Applied Physics Symposium Collection of Lectures, 2005, Saitama University.

Matsuno, A., et al., "One Dimensional Thermal Diffusion Simulation for the USJ formation by green laser anneal with absorption layer", 16-YE-1, 52nd Japan Society of Applied Physics Symposium Collection of Lectures, 2005, Saitama University.

Mizuno, B., et al., "ECR Plasma Doping", Matsushita Electric Industrial Co., Ltd.

Higaki, R., et al., "Effects of gas phase absorption into Si substrates on plasma doping process".

Lenoble, D., et al., "Fabrication of 60-nm plasma doped CMOS transistors", 2002, IEEE.

Ito, T., et al., "Improvement of Threshold Voltage Roll-off by Ultra-shallow Junction Formed by Flash Lamp Annealing", 2003, Symposium on VLSI Technology Digest of Technical Papers.

Severi, S., et al., "Diffusion-less junctions and super halo profiles for PMOS transistors formed by SPER and FUSI gate in 45nm physical gate length devices", 2004, IEEE.

International Search Report corresponding to application No. PCT/JP2004/001473, dated Apr. 13, 2004.

D. Lenoble et al., "Reliable and enhanced performances of sub-0.1 μm pMOSFETs doped by low biased Plasma Doping", 2000 Symposium on VLSI Technology Digest of Technical Papers, IEEE, pp. 110-111, 2000.

Y. Kiyota, "Surface Reaction Doping using Gas Source for Ultra Shallow Junctions", Japan Society of Applied Physics, 2000.

Y. Kiyota, "Role of hydrogen during rapid vapor-phase doping analyzed by x-ray photoelectron spectroscopy and Fourier-transform infrared-attenuated total reflection", Journal of Vacuum Science and Technology A 16(1), pp. 1-5, Jan./Feb. 1998.

Y. Kiyota, "Surface Reaction Doping using Gas Source for Ultra shallow Junction", Silicon technology No. 39, pp. 9-11, Jun. 2002.

Y. Sasaki et al., "Gas Phase Doping at Room Temperature", Extended Abstracts of International Workshop on Junction Technology 2002, pp. 39-40.

Y. Sasaki et al., "$B_2H_6$ Plasma Doping with In-situ he Pre-amorphization", 2004 Symposium on VLSI Technology Digest of Technical Papers, pp. 180-181.

Japanese Office Action issued in Japanese Patent Application No. JP 2005-513389 dated Oct. 27, 2009.

* cited by examiner

METHOD FOR FORMING IMPURITY-INTRODUCED LAYER, METHOD FOR CLEANING OBJECT TO BE PROCESSED APPARATUS FOR INTRODUCING IMPURITY AND METHOD FOR PRODUCING DEVICE

This application is the U.S. National Phase under 35 U.S.C. §371 of International Application No. PCT/JP2004/012583, filed Aug. 25, 2004, which in turn claims the benefit of Japanese Application No. 2003-299596, filed Aug. 25, 2003, the disclosures of which Applications are incorporated by reference herein in their entirety.

TECHNICAL FIELD

The present invention relates to a method for introducing impurity into an object to be processed, thereby forming an impurity-introduced layer. To be more specific, the method is used in the process of manufacturing semi-conductors or liquid crystal, and introduces particles into an object to be processed, e.g. a silicon-substrate, through plasma-doping, ion-implantation, or deposition, thereby forming an impurity introduced layer. The present invention also relates to a method for cleaning the object such as the silicon substrate, and an impurity-introducing apparatus for providing the foregoing methods, and yet, the present invention relates to a method for manufacturing devices such as transistors, diodes, resistors and capacitors.

BACKGROUND ART

A conventional method of cleaning silicon substrates to be used as material of semiconductors has used hydrogen fluoride, mixed solution such as sulfuric acid and hydrogen peroxide water, mixed solution of hydrochloric acid and hydrogen peroxide water, or mixed solution of ammonia water and hydrogen peroxide water. A silicon substrate is dipped into a bath in which the foregoing mixed solution is filled. For instance, after boron implantation, the silicon substrate undergoes an anneal process for diffusing the boron. However, before undergoing the anneal process, the silicon substrate must be cleaned with a solution diluted at a given concentration. The solution includes hydrogen fluoride, mixed solution of sulfuric acid and hydrogen peroxide water, mixed solution of hydrochloric acid and hydrogen peroxide water, or mixed solution of ammonia water and hydrogen peroxide water. Bathes containing one of the foregoing solutions and the bath containing extra-pure water are arranged, and the solutions are combined or a cleaning time is adjusted depending on an application of the substrate, so that the substrate is cleaned.

Ion implantation is used as a method for introducing particles into silicon substrates, and plasma-doping is a promising method to be used in the next generation for introducing particles into substrates efficiently with ultra-low energy. After the introduction of particles, a level of metal contamination is a cause for concern, in particular, when the plasma doping is used because of the following reason: In the case of ion implantation, particles other than desired ones are removed by an analytical electromagnet; however, the plasma doping does not use the analytical electromagnet and exposes the silicon substrate directly to plasma. In other words, the chamber inner wall is exposed to plasma, and the silicon substrate is exposed to the same plasma, so that metal contamination caused by the chamber tends to occur. Such a study is reported in, e.g. the following document: "Proc. Of the 1997 IEEE International Symposium on Semiconductor Manufacturing Conference, San Francisco, Calif., Oct. 6-8, 1997, p. B-9", and "Proc. of the 2000 International Conference on Ion Implantation Technology, Alpbach, Austria, 17-22 Sep. 2000, p. 500-503"

According to the foregoing reports, the concerns about the metal contamination can be solved at a research and development stage; however, the contamination level is not yet improved as good as that of the ion implantation.

In general, not only the plasma doping but also the ion implantation aggravates the level of contamination, e.g. metal contamination of an object such as a silicon substrate after the introduction of particles comparing with the level before the introduction thereof, and the contamination is caused by an impurity introducing apparatus. The metal contamination is one of the factors lowering an yield rate of semiconductor devices. Hydrogen fluoride has higher cleaning power than the mixed solution of sulfuric acid and hydrogen peroxide water, so that solution including hydrogen fluoride is often used for cleaning silicon substrates after the ion implantation.

After introduction of particles into a silicon substrate, and before an anneal process, a cleaning of the silicon substrate reveals another problem in the case when the particles are introduced with so little energy that the depth becomes not greater than 15 nm, more particularly not greater than 10 nm, which makes an atomic concentration of the particles 1E18 atoms/cm$^3$. To be more specific, particles introduced in the substrate at such a shallow depth are washed away in the cleaning step, although the particles are introduced to be dopant. Thus fewer particles are electrically activated at the anneal process, and as a result, desirable characteristics cannot be expected.

To overcome the foregoing problem is important for the plasma doping among others. The plasma doping introduces particles of dopant not only by doping charged particles through acceleration into an object such as a silicon substrate, but also through adsorption and infiltration of particles by using radical and gas onto a principal surface of the silicon substrate. The particles are introduced by radical and gas with so low energy that the particles are introduced at a shallow depth of the silicon substrate. This is different from the behavior of the charged particles which are doped by an accelerated voltage. This mechanism inevitably allows introducing particles with low energy by radical and gas although an accelerating voltage of several hundreds volt is applied to plasma by controlling a bias electric potential. The particles introduced with such low energy out of all the dopant will be washed away, so that a desirable sheet resistance cannot be expected as discussed above.

It is essential to clean semiconductor substrates including silicon substrates for maintaining yields of semiconductor devices. Concerning the plasma doping among others, it is not yet reported that its contamination level reaches to a level similar to that of the ion implantation in manufacturing, so that a method of cleaning after the doping becomes critical.

A cleaning method of semiconductor substrates is needed because of the foregoing circumstances. The required method preferably cleans semi-conductor substrates before the anneal process at a level maintaining yields of semi-conductor devices, and yet, maintains an amount of introduced particles throughout the cleaning step.

On the other hand, the following method is widely used: a resist-pattern is formed on, e.g. a silicon substrate, and impurity is introduced onto an exposed section of a principal surface of the silicon substrate. The resist is attached onto the substrate in a desired pattern before the impurity is introduced, and removed after the introduction but before the anneal process. The resist is often removed by an ashing method, which irradiates the resist with oxygen-plasma. When particles are introduced at a shallow depth of the principal surface, removal of resist by a conventional method before the anneal process will remove particles together with the resist although the particles have been introduced to be dopant. Thus the anneal process activates electrically fewer particles, so that desirable characteristics cannot be expected.

The foregoing situation needs a better method of removing resist or an appropriate combination of a resist-removing method and an impurity-introducing method. The better method or the appropriate combination preferably removes resist attached to the substrate after the introduction of particles but before an anneal process, and yet, preferably maintains an amount of the introduced particles throughout the resist-removing step.

DISCLOSURE OF INVENTION

The present invention addresses the problems discussed above, and aims to provide a cleaning method that can clean a semiconductor substrate (solid substrate) such as a silicon substrate, in which impurity such as particles have been introduced. The cleaning method cleans the foregoing solid substrate at a level necessary for maintaining an yield rate of electronic devices before the substrate undergoes an anneal process, and yet, the method will not decrease particles introduced in the cleaning step.

The present invention also aims to provide a method of removing resist. After the particles are introduced into the solid substrate, the method can remove resist attached to the solid substrate before the anneal process, and yet, the method will not decrease the particles in the resist-removing step.

The inventors conduct various experiments to find out a problem not observed in the past: The inventor carry out various kinds of plasma doping, which injects particles into a solid substrate, e.g. a silicon substrate, using different states of particles, i.e. particles having major ingredient of ion, and another ones having major ingredient of gas and radical. The inventors also carry out various kinds of cleaning with different solutions and cleaning times. They find out, after the particles introduction and before the anneal process, that particles injected to be dopant by a doping with low energy at a depth not greater than 15 nm, particularly not greater than 10 nm are washed away by cleaning. This doping with low energy makes the atomic concentration of the particles to be 1E18 atoms/cm$^3$. On top of that, at a limited accelerating voltage, cleaning of the solid substrate with mixed solution of sulfuric acid and hydrogen peroxide water does not reduce the particles introduced to be dopant. The foregoing experiments invite the present invention.

The inventors also develop a technique that can change a method of doping with a state of particles to be injected, namely, the particles having major ingredient of ion, and another particles having major ingredient of gas and radical. A conventional doping method introduces impurity in the states of ion, gas and radical into a silicon substrate. The inventors change a ratio of ion, gas and radical, and carry out the cleaning as well as the resist removal for the first time to find out the foregoing result.

Based on the experiments discussed above, namely, different kinds of the plasma doping with different states of particles injected into the solid substrate, one state has major ingredient of ion, and another state has major ingredient of gas and radical, and the resist removal by irradiation of oxygen-plasma, the inventors find out the following new matters: After the particles are introduced into the solid substrate, when the resist is removed before the anneal process, reproducibility of a dose-loss changes depending on the method of introducing impurity having major ingredient of ion and the method of introducing impurity having major ingredient of gas and radical. Further the first method, i.e. using plasma doping with the major ingredient of ion, can reduce the dose-loss in the resist removal step where irradiation of the oxygen-plasma is employed.

On top of that, based on the experiments of the resist removal by oxygen-plasma irradiation, and the cleaning by hydrogen fluoride or mixed solution of sulfuric acid and hydrogen peroxide water, the inventors also find out the following new matter: The dose-loss can be reduced in the steps of the resist removal, cleaning, and anneal process by forming an oxide layer on a principal surface of the solid substrate after the introduction of the particles into the substrate and before the anneal process.

In the present invention, a solid substrate having a deposit containing desirable particles is cleaned by bringing the substrate in contact with mixed solution of sulfuric acid and hydrogen peroxide water before the anneal process. Here is still another cleaning: The solid substrate having undergone the ion implantation with low energy at a depth not greater than 15 nm, particularly not greater than 10 nm, where the atomic concentration of the particles becomes 1E18 atoms/cm$^3$, is cleaned by contacting with the mixed solution of sulfuric acid and hydrogen peroxide water before the anneal process. The energy, making the depth as shallow as not greater than 15 nm, particularly not greater than 10 nm, is preferably an accelerating voltage between 30V and 500V, particularly not greater than 200V in the case of, e.g. implanting boron in a drift mode, although the energy differs depending on a method of ion implantation.

The reason why the foregoing energy is preferable is this: Implantation of accelerated boron with low energy at an accelerating voltage not greater than 500V, the depth where the atomic concentration of the boron becomes 1E18 atoms/cm$^3$ is not greater than 15 nm, so that the problem tends to occur. Further when the accelerating voltage is not greater than 200V, the depth becomes 10 nm, so that the problem tends to occur more often. In the case of the accelerating voltage being not greater than 30V, beam transport from an ion source to a target, e.g. a solid substrate, is hardly realized now and in the future, so that this case is not a realistic one, and the accelerating voltage is preferably not smaller than 30V.

Meanwhile, the inventors have achieved success in lowering a contamination level of the substrate, which introduces particles, through the efforts toward improving the contamination level of a plasma doping apparatus. To be more specific, use of the plasma-doping apparatus of which inner wall is coated with at least one of quartz, silicon, silicon nitride, desirable impurity, and nitride including desirable impurity or oxide including desirable impurity achieves the success. Thus combination of a method of making an initial state of a substrate less contaminated, a method of cleaning with mixed solution of sulfuric acid and hydrogen peroxide water, a method of making the substrate less contaminated after the plasma-doping, and forming an oxide layer can achieve the objective of lowering the contamination level.

In this invention, use the plasma-doping apparatus of which inner wall is coated with at least one of quartz, silicon, silicon nitride, desirable impurity, and nitride including desirable impurity or oxide including desirable impurity, and introduces particles into a solid substrate, then clean the solid substrate of which contamination level is not greater than 1E10 atoms/cm$^2$ with cleaning fluid before the anneal process. Use of mixed solution of sulfuric acid and hydrogen peroxide water as the cleaning fluid is preferable because the solution will not reduce the particles introduced into the solid substrate. Other cleaning fluids can work as far as they can form an oxide layer.

The present invention proves that the particles introduced at an accelerating voltage not lower than 30V can remain in the solid substrate without being washed away by mixed solution of sulfuric acid and hydrogen peroxide water. Use the plasma-doping apparatus of which inner wall is coated with at least one of quartz, silicon, silicon nitride, desirable impurity, and nitride including desirable impurity or oxide including desirable impurity, and then introduce particles into the solid substrate, and make a contamination level of the solid substrate, in which the particles have been introduced, not higher than 1E10 atoms/cm$^2$, so that cleaning the surface of the solid substrate weakens its adverse effect to the dopant.

In other words, the cleaning step aims to clean mainly not a surface of a solid substrate but an underside of the substrate, and ideas of shortening a cleaning time or lowering a concentration of the solution will achieve the foregoing objectives.

It is preferable to bring the solid substrate in contact with the mixed solution of sulfuric acid and hydrogen peroxide water in not longer than 10 minutes, because the dopant particles are hardly washed away within 10 minutes.

It is desirable to clean solid substrates without contacting with hydrogen fluoride because the contact with hydrogen fluoride will wash away dopant quickly in a short time although hydrogen fluoride has been used in a conventional cleaning.

The cleaning method discussed above is effective also in manufacturing devices including active components such as semi-conductors, liquid crystal, bio-chips as well as passive components such as resistors, coils and capacitors.

DETAILED DESCRIPTION OF PREFERRED EMBODIMENTS

Figure 1:
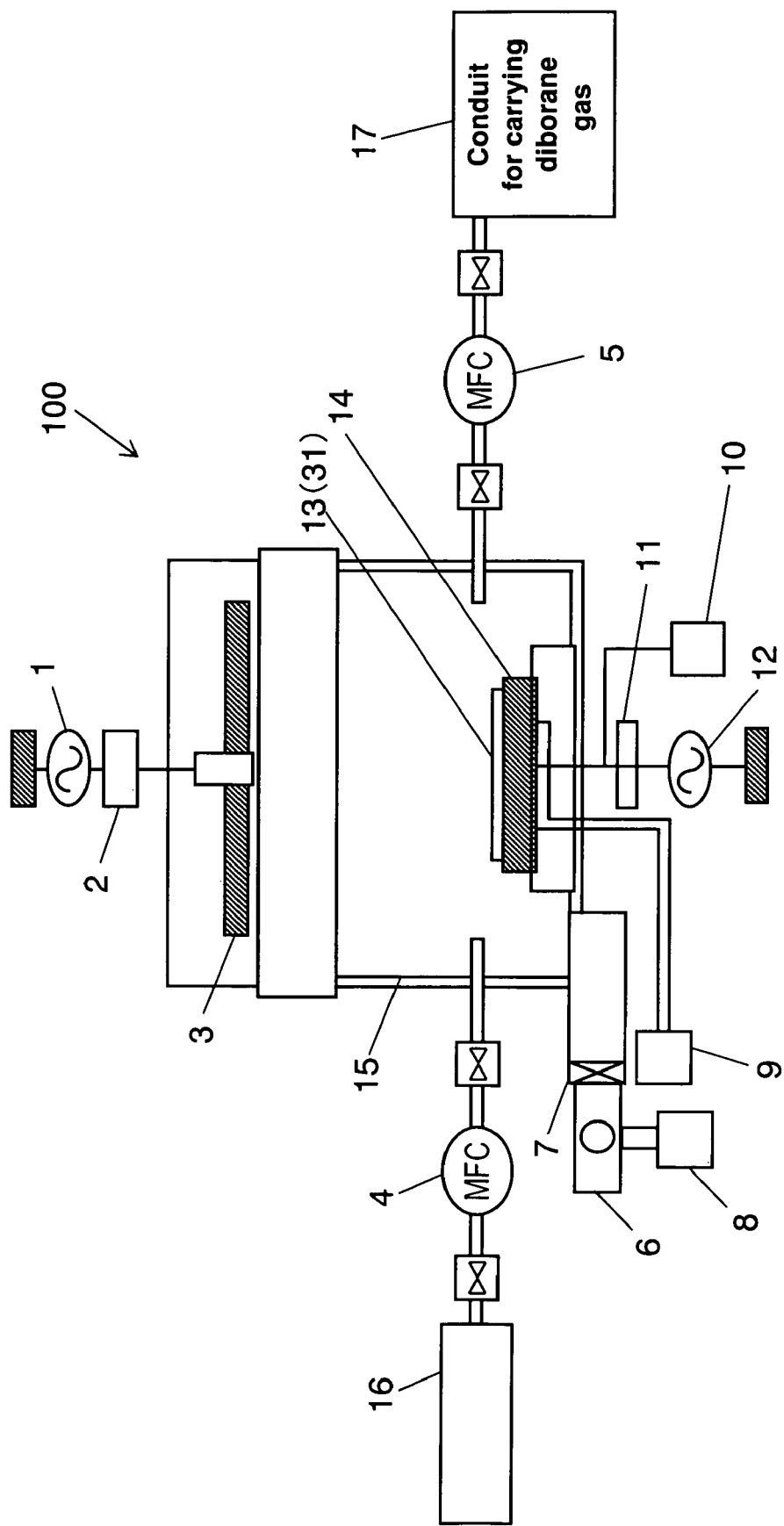
FIG. 1 shows an impurity introducing apparatus used in an embodiment of the present invention.

Exemplary embodiments of the present invention are detailed hereinafter with reference to the accompanying drawings. FIG. 1 shows apparatus 100 used in an embodiment of the present invention. Apparatus 100 is formed of high-frequency power supply 1, matching box 2, coil and antenna 3, mass-flow controllers (MFC) 4 and 5, turbo-molecular pump 6, conductance valve 7, drying pump 8, circulator 9, power supply 10, matching box 11, high-frequency power supply 12, and lower electrode 14. Silicon substrate 13 as an object to be processed is placed on lower electrode 14.

Power supply 10 is used for applying a bias voltage and employs an AC power source having a frequency of 600 Hz. In this description, an accelerating voltage in plasma doping is expressed in figures with Vdc, which indicates an average of bias voltages applied by an AC. The difference between peak to peak voltages is approx. two times the Vdc. In an embodiment of the present invention, a silicon substrate, one of semiconductor substrates is taken as an example of an object to be processed; however, other solid substrates such as compound semiconductor substrates, strain silicon substrates, and SOI substrates also can work as objects to be processed.

FIG. 1 shows a state where silicon substrate 13 is transported into process chamber 15, then placed on lower electrode 14. Conduit 16 for carrying gas to be used in plasma irradiation and amorphization into process chamber 15 is prepared, and conduit 17 for carrying diborane gas into chamber 15 is prepared independently of conduit 16. Plasma-irradiation and amorphization is a step where a solid substrate, e.g. a silicon substrate, is irradiated with plasma so that a surface of the substrate can be amorphized. In an embodiment of the present invention, the technical term of "plasma-irradiation and amorphization" is sometimes used; however, the amorphization is not limited to plasma irradiation. For instance, ion-implantation using ionized Ge or Si allows the amorphization.

The plasma used in the plasma-irradiation and amorphization employs rare-gas plasma such as helium, neon, argon, xenon, or hydrogen plasma, or mixed gas of the foregoing gases. Plasma containing germanium (Ge) or silicon (Si) can be irradiated. Diborane gas is processed by plasma and used for $B_2H_6$ plasma doping, or is introduced into chamber 15 as it is and used for gas doping. Instead of diborane gas, hydrogen-compound gas containing boron such as $B_4H_{10}$, $B_5H_9$, $B_5H_{11}$, $B_6H_{10}$, $B_{10}H_{14}$ can be used. The hydrogen-compound gas containing the boron is preferably used because it makes an etching rate which etches Si during the plasma irradiation so small that the silicon substrate is hardly etched in the process. Fluoride gas containing boron such as $BF_3$, $B_2F_4$ can be used instead, or chloride gas containing $B_2Cl_4$, $BCl_3$ can be used. In the case of using a solid processed by plasma, $BI_3$, $Br_3$, $B_2O_3$, $B_2S_3$, or BN can be used.

Gas flow-quantity into process chamber 15 can be controlled by mass-flow controllers 4, 5 independently. Although not shown in FIG. 1, a conduit for conveying dilution gas and a mass-flow controller are prepared around chamber 15 in order to change a dilution rate of the diborane gas. Helium gas is used as dilution gas.

Figure 2:
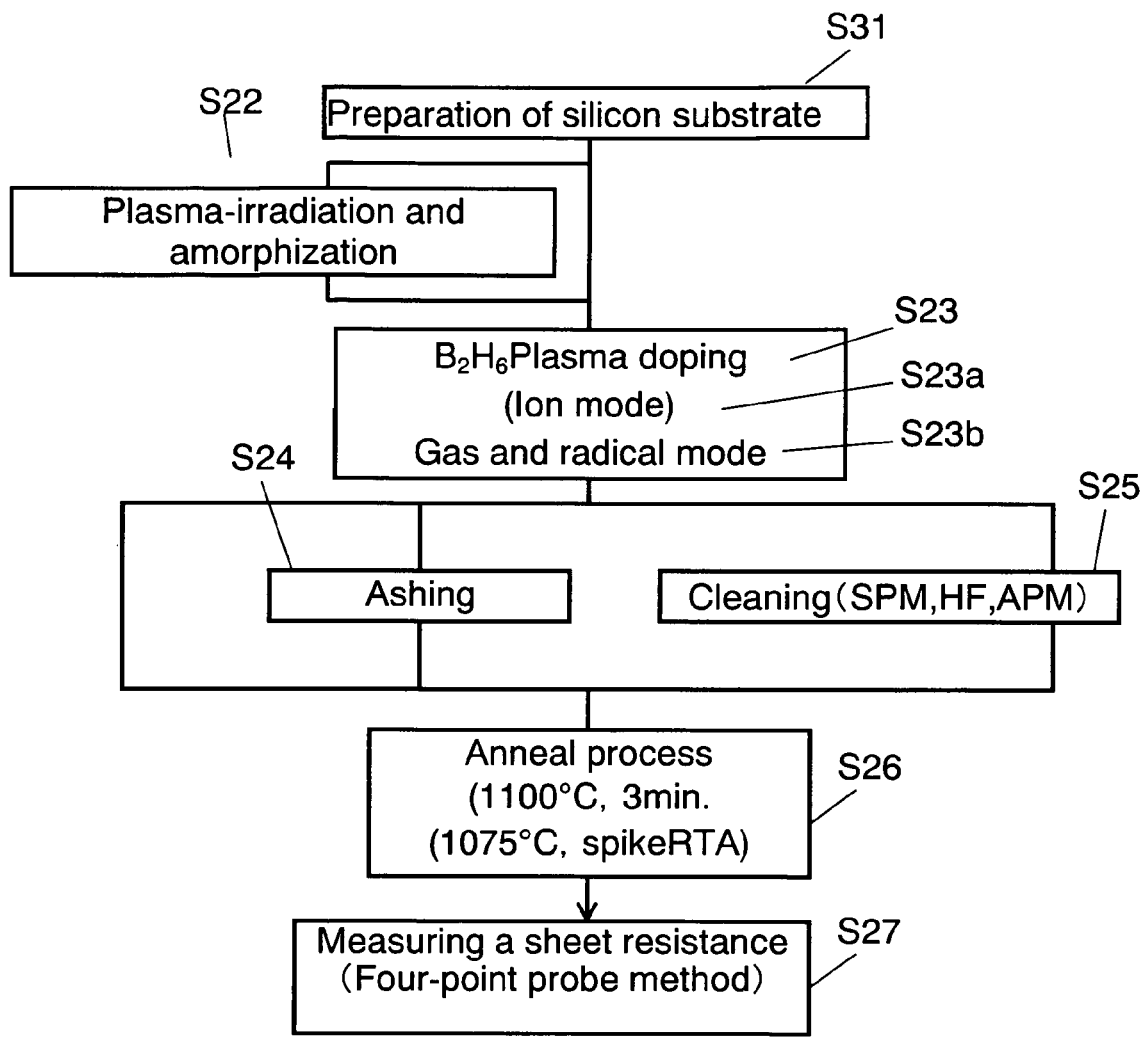
FIG. 2 shows a flowchart illustrating an embodiment of the present invention.

FIG. 2 shows a flowchart illustrating an embodiment of the present invention. First, place silicon substrate 13 on lower electrode 14, then conduct the $B_2H_6$ plasma doping with diborane gas in step S23. Diborane ($B_2H_6$) gas used here is diluted by helium (He) gas. Hereinafter $B_2H_6$ plasma doping carried out using diborane gas in step S23 is referred to simply as plasma doping S23.

Plasma doping S23 is carried out in two ways, i.e. in ion-mode S23a and in gas and radical mode S23b. Ion-mode S23a injects ions of the plasma into silicon substrate 13, thereby introducing impurity into the substrate.

On the other hand, gas and radical mode S23B introduces gas and radical together with ions of the plasma into silicon substrate 13, or attaches or deposits them onto a principal face of substrate 13, thereby introducing impurity onto or into substrate 13. Conditions of plasma-doping S23 are changed as follows: a rate of diluting diborane with helium (gas concentration of $B_2H_6$/He) changes in the range from 0.025%/99.975% to 5%/95%. A source power of high-frequency power supply 1 changes in the range from 1000 W to 1500 W. A pressure changes in the range from 0.9 Pa to 2.5 Pa. A typical ion-mode S23a is carried out in the following conditions: gas concentration of $B_2H_6$/He at 0.025%/99.975%, a source power at 1500 W, and a pressure at 0.9 Pa. A typical gas and radical mode S23b is carried out in the following conditions: gas concentration of $B_2H_6$/He at 5%/95%, a source power at 1000 A, and a pressure at 2.5 Pa.

Gas and radical mode S23b contains boron, which tends to deposit or attach onto the surface of silicon substrate 13, so that much of the boron remains in a shallow part of substrate 13. However, comparatively small amount of boron which is injected as ion into substrate 13 also exists. The boron injected as ion gets energy from the electric field applied as a bias voltage, so that the boron is introduced into a deeper part from the principal face of substrate 13 than other boron introduced as gas or radical.

As a result, the SIMS profile of the boron immediately after plasma-doping S23 in gas and radical mode S23b shows a higher concentration at the utmost surface of the principal face of silicon substrate 13. The profile, in which a boron concentration falls within the range between 1E18 $cm^{-3}$ and 1E21 $cm^{-3}$, projects downward as the concentration lowers as shown in FIG. 3.

Figure 3:
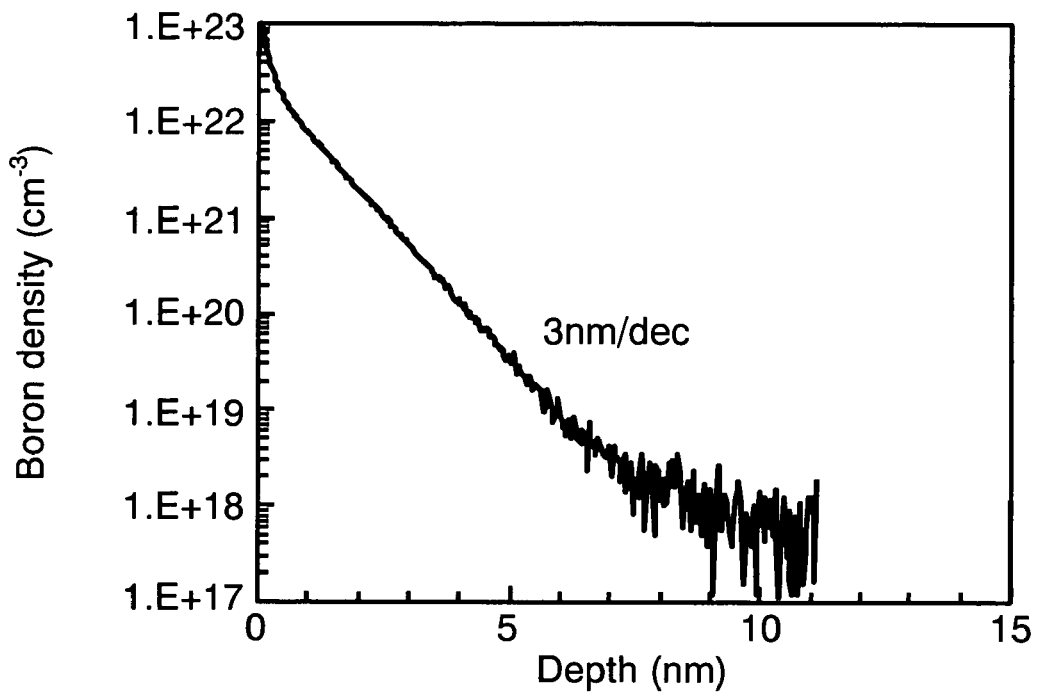
FIG. 3 shows an SIMS profile (SIMS) in a depth direction of boron measured with a secondary ion mass spectrometer (SIMS) at plasma doping in a radical mode in accordance with an embodiment of the present invention.

FIG. 3 shows an SIMS profile having undergone plasma-doping S23 in the foregoing typical gas and radical mode S23b for 7 seconds at 100V bias voltage. Features of this profile are a high concentration of boron at the utmost surface of silicon substrate 13 and a gentle steep of the profile. The steep of a profile is a distance needed for lowering a boron concentration by one digit, and in general, a steep is expressed in a distance needed for a boron concentration to lower from 1E18 $cm^{-3}$ to 1E21 $cm^{-3}$. The gentle steep is caused by the profile between 1E18 $cm^{-3}$ and 1E21 $cm^{-3}$, which profile projects downward with a lower concentration plotted at a lower point in FIG. 3. The profile shown in FIG. 3 expresses the boron concentration at the utmost surface approx. 8E22 $cm^{-3}$ at the steep of 3 nm/decade.

Plasma-doping in ion-mode S23a injects comparatively a greater amount of boron as ion, so that a greater amount of boron is injected into a deeper part of silicon substrate 13 than in gas and radical mode. The bias voltage is applied in AC, so that a depth of an impurity introduced layer of the principal surface to which boron is injected is determined by a bias voltage applied momentarily. Since a greater amount of boron is injected as ion, a ratio of an amount of boron injected into a deeper part of silicon substrate 13 vs. the total amount of injected boron is greater than the ratio in gas and radical mode S23b. Gas and radical has low energy because they do not get an electromagnetic energy for injection from the bias voltage, so that the mechanism discussed above is established.

As discussed above, the SIMS profile of boron immediately after plasma-doping S23 in ion mode S23a shows a lower boron concentration at the surface of silicon substrate 13 than that of gas and radical mode S23b. The profile at boron concentration ranging from 1E18 $cm^{-3}$ to 1E21 $cm^{-3}$ projects upward as the concentration lowers as shown in FIG. 4.

Figure 4:
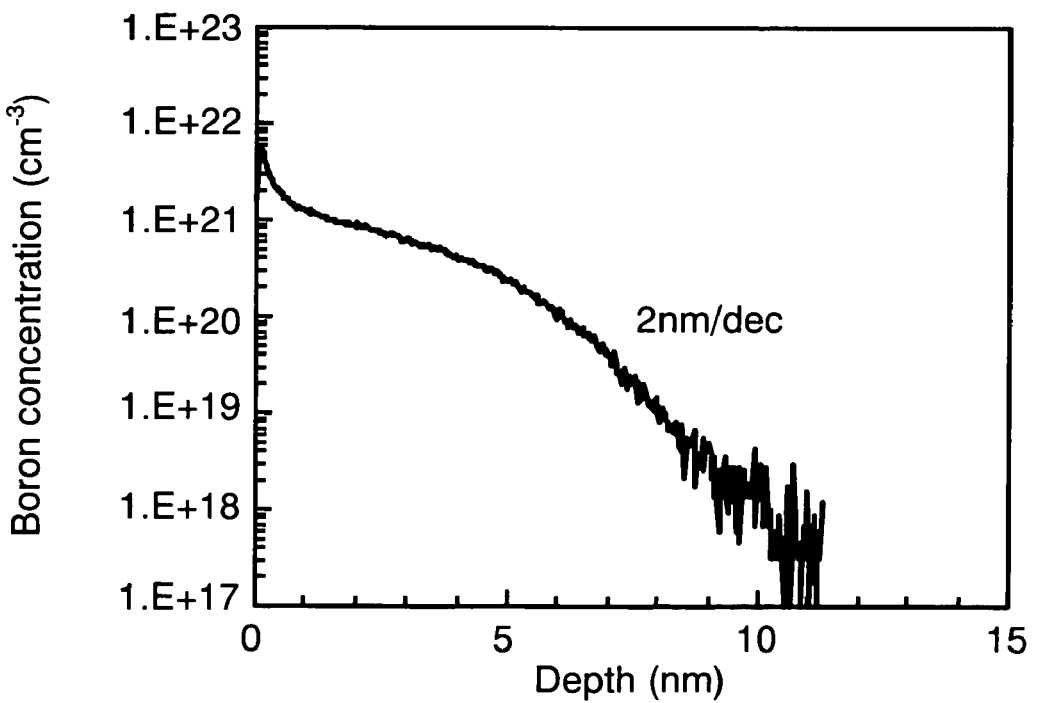
FIG. 4 shows an SIMS doping profile at a plasma doping in an ion mode in accordance with an embodiment of the present invention.

FIG. 4 shows an SIMS profile having undergone plasma-doping S23 in the foregoing typical ion mode S23a for 30 seconds at 100V bias voltage. Features of this profile are a lower concentration of boron at the utmost surface of silicon substrate 13 than that in gas and radical mode and a sharp steep of the profile. The profile shown in FIG. 4 expresses the boron concentration at the utmost surface approx. 8E21 $cm^{-3}$ at the steep 2 nm/decade.

Before plasma-doping S23, the impurity is introduced, i.e. plasma irradiation and amorphization S22 is carried out through irradiation of rare gas plasma such as helium, neon, argon or xenon. Hydrogen gas, or mixed gas of those gases can be used. Plasma containing Ge, or Si also can be used.

In an embodiment of the present invention, helium plasma is used in the following conditions: Helium gas concentration: 100%, Source power of high-frequency power supply 1:

1500 A, Pressure: 0.9 Pa, Bias voltage: 150V, and Plasma irradiation and amorphization: 7 seconds.

After plasma irradiation and amorphization S22, plasma-doping S23 in the foregoing typical gas and radical mode S23b is carried out. The principal face of silicon substrate 13 is amorphized by plasma irradiation and amorphization S22, so that boron of the gas and radical can be introduced into silicon substrate 13 more easily than the case where the face is not amorphized.

Figure 5:
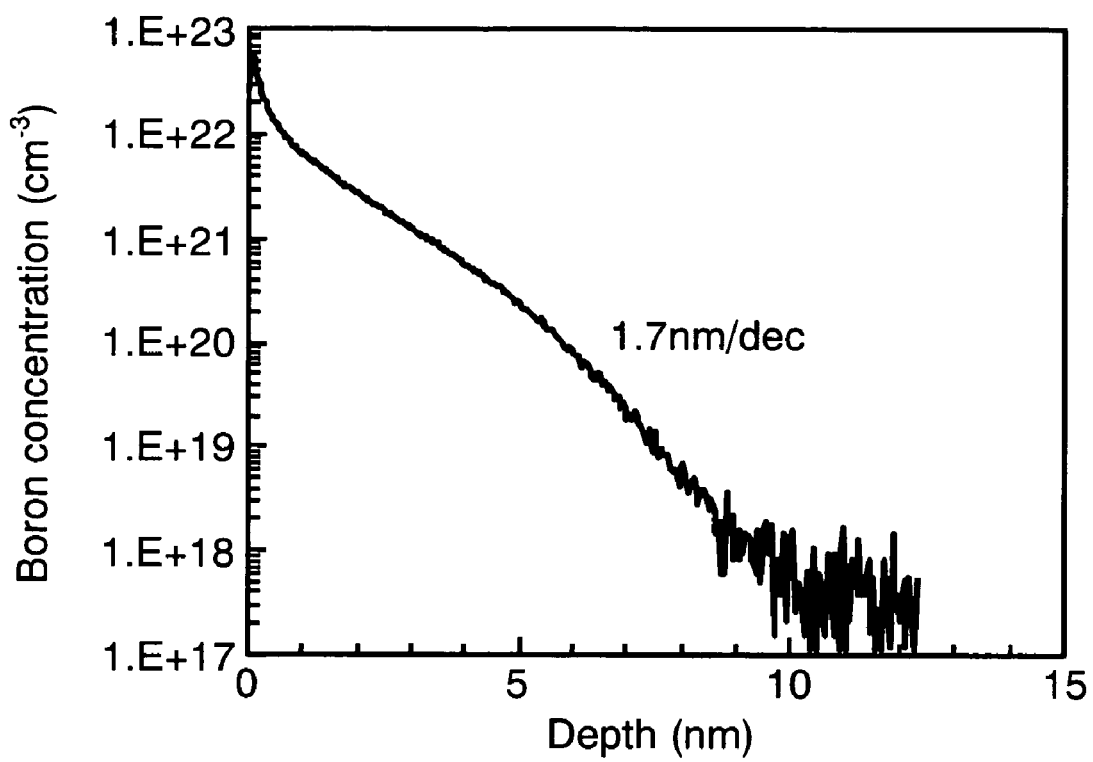
FIG. 5 shows an SIMS profile immediately after plasma doping in a gas and radical mode after a solid substrate has undergone plasma irradiation and amorphization.

FIG. 5 shows an SIMS profile immediately after plasma-doping S23 in the foregoing typical gas and radical mode having conducted following plasma-irradiation and amorphization S22. The features of the profile are the following two points: the boron concentration at the utmost surface of silicon substrate 13 is a medium between that of ion mode S23a and that of gas and radical mode S23b; and the profile is sharply steep. The profile shown in FIG. 5 expresses the boron concentration at the utmost surface approx. 4E22 cm$^{-3}$ at the steep 1.7 nm/decade.

As discussed above, plasma-doping S23 in gas and radical mode S23b leaves boron attached onto the utmost surface of silicon substrate 13 in a large amount out of the total amount of boron introduced into substrate 13, so that the steep becomes gentle. Plasma-doping S23 in ion mode S23a leaves boron injected inside substrate 13 in a great amount out of the total amount of boron introduced in substrate 13, so that a less amount or little amount of boron attaches to the surface. As a result, the steep becomes sharp.

Plasma-doping S23 in gas and radical mode S23b having conducted following plasma-irradiation and amorphization S22 infiltrates boron into silicon substrate 13 and leaves less amount or little amount of boron attached on the utmost surface of the principal face of substrate 13. Thus the steep in this case also becomes sharp. Plasma-doping S23 in ion mode S23a having conducted following the plasma-irradiation and amorphization S22 leaves less amount of boron attached to the utmost surface of substrate 15, so that the steep becomes sharp.

The foregoing facts tell that only plasma-doping S23 in gas and radical mode S23b leaves boron attached to the utmost surface of silicon substrate 13. Other cases, e.g. plasma-doping S23 in ion mode S23a, or plasma-doping S23 in gas and radical mode S23b following the plasma irradiation and amorphization S22, or plasma-doping S23 in ion mode S23a following the plasma irradiation and amorphization S22 leaves less amount of boron attached to the utmost surface of silicon substrate 13.

After plasma-doping S23, silicon substrate 13 is taken out from process chamber 15, then ashing S24 or cleaning S25 is conducted. In the step of ashing S24, silicon substrate 13 is transferred into a process chamber of an ashing apparatus not shown in the drawings. The ashing apparatus includes a down-flow plasma ashing chamber. Then substrate 13 is irradiated with oxygen-plasma in the conditions of a source power of the high-frequency power supply at 1800 W, 260° C., and 133 Pa. An irradiation time of oxygen-plasma is changed 10 seconds, 25 seconds and 60 seconds. In the cleaning step, three kinds of cleaning fluids are used, namely, SPM (mixed solution of sulfuric acid and hydrogen peroxide water, $H_2SO_4$ and $H_2O_2$ at 6:1, and 4:1), HF (hydrogen fluoride diluted with extra-pure water into 1% concentration), and APM (mixed solution of $NH_4OH$, $H_2O_2$, $H_2O$ at 1:1:5).

SPM and APM are used at 80° C. and HF is used at an ambient temperature. Silicon substrate 13 having undergone plasma-doping S23 is cleaned with SPM, HF, and APM respectively, then rinsed with extra-pure water and dried. For a comparison purpose, substrate 13 is directly carried to anneal process S26 without conducting ashing S24 or cleaning S25.

After ashing S24 or cleaning S25, silicon substrate 13 undergoes anneal process S26, which is done with a halogen lamp at 1100° C. for 3 minutes. This condition of anneal process S26 encourages electrical activation of the dopants, so that Rs(0)/Rs(t) well reflects the number of dopants remained in silicon substrate 13 after cleaning S25. Rs (0) represents a sheet resistance after anneal process S26 following plasma-doping S23 skipping both of ashing S24 and cleaning S25. Rs (t) represents a sheet resistance after anneal process S26 following plasma-doping S23 and ashing S24 for "t" second or cleaning S25 for "t" minute. Rs(0)/Rs(t) is a ratio of Rs(0) vs. Rs(t).

Anneal process S26 at 1075° C. spike RTA is carried out in order to find the effect of ashing S24 or cleaning S25 on a sheet resistance after the spike RTA. The spike RTA (spike Rapid Thermal Annealing) is a process where heating is stopped at the maximum temperature (1075° C.) and then the temperature is lowered. The sheet resistance is then measured through a four-point probe method (S27).

Figure 6:
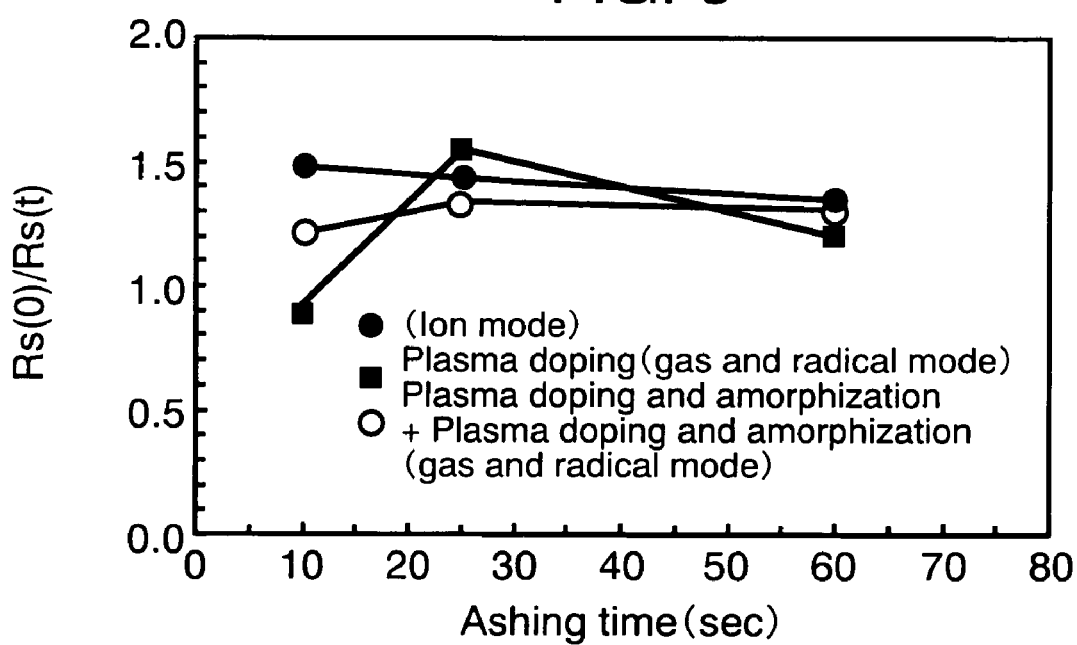
FIG. 6 illustrates influence of impurity introduction and an ashing method on a sheet resistance in accordance with an embodiment of the present invention.

FIG. 6 shows characteristics illustrating effects of the impurity introduction and an ashing time on a sheet resistance in accordance with an embodiment, and shows variation of the ashing time and the sheet resistance. Anneal process S26 is done at 1100° C. for 3 minutes.

The y-axis of FIG. 6 represents a ratio of Rs (0) vs. Rs (t), i.e. a sheet resistance immediately after the anneal process following the ashing. The x-axis represents an ashing time. The impurity introduction is carried out in the following three ways: plasma-doping S23 in the foregoing typical gas and radical mode S23b; plasma-doping S23 in the foregoing typical ion mode S23a; and plasma-doping S23 in the foregoing typical gas and radical mode S23b following the plasma irradiation and amorphization using the helium plasma.

After plasma-doping S23 in ion-mode S23a in accordance with an embodiment of the present invention, the ashing before the anneal process reduces the sheet resistance by approx. 30%. Variation of an ashing time hardly changes the sheet resistance.

After plasma-doping S23 in gas and radical mode S23b following plasma irradiation and amorphization S22 in accordance with an embodiment of the present invention, ashing S24 prior to anneal process S26 reduces the sheet resistance, and variation of an ashing time hardly changes the sheet resistance.

After plasma-doping S23 in gas and radical mode S23b in accordance with an experiment conducted for the comparison purpose, ashing S24 changes the sheet resistance greatly. Boron attached to the principal face of silicon substrate 13 tends to be flown away in the ashing step; however, the rate of an amount to be flown away is caused by a dispersion of the sheet resistance depending on the variation of the ashing time, because of poor reproducibility of the flying-away. Although this will be detailed later, the formation of an oxide layer through oxygen-plasma irradiation has some contribution to prevention of the boron from flying away. However, the boron not being flown away has poor reproducibility comparing with the boron attached to or adsorbed to the utmost surface of silicon substrate 13. Boron introduced or infiltrated into a silicon substrate even at a shallow depth, a rate of boron not being flown away has an excellent reproducibility.

Figure 7:
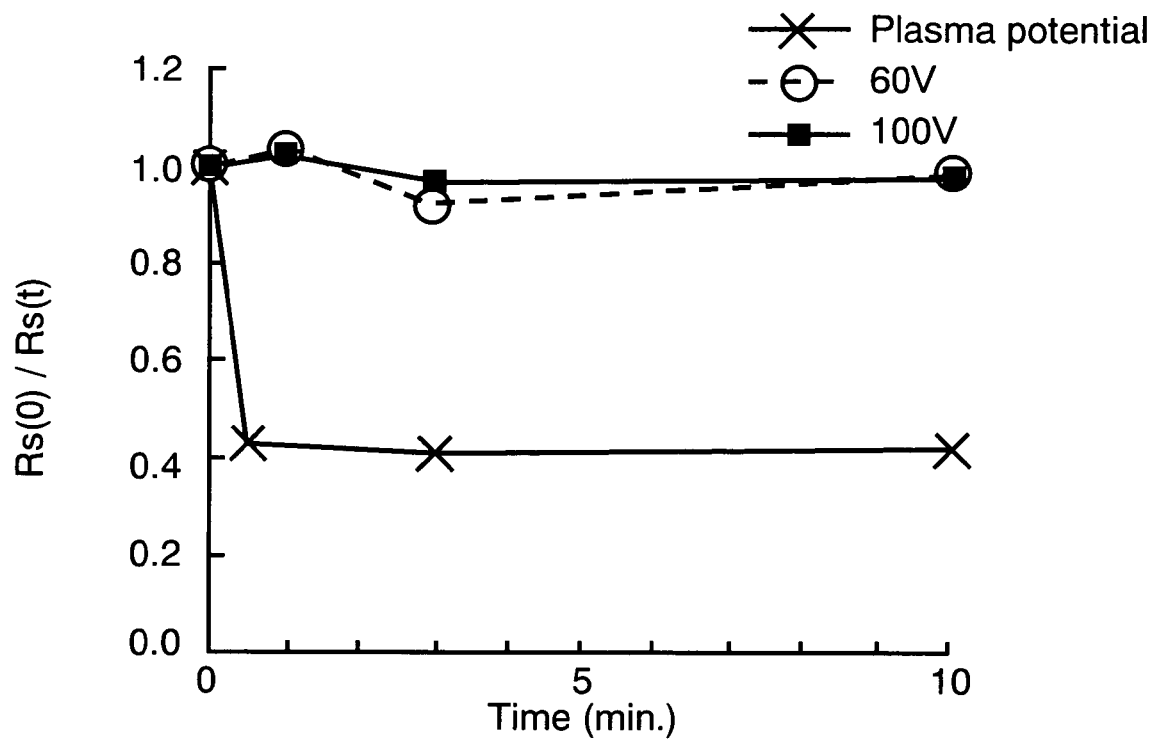
FIG. 7 illustrates influence of a cleaning method on a sheet resistance in accordance with an embodiment of the present invention.

FIG. 7 shows characteristics illustrating relations between a cleaning time and a sheet resistance in accordance with an embodiment, i.e. the relations tell variations of the sheet resistance in response to the cleaning times. The vertical axis represents a ratio of Rs (0) vs. Rs (t), where Rs (t) is a sheet resistance after an anneal process following a cleaning with SPM. The horizontal axis represents the time of cleaning with SPM.

The relations are detailed hereinafter with reference to the flowchart shown in FIG. 2. Plasma-doping S23 is carried out for 60 seconds in the foregoing typical ion mode S23a. A biased accelerating voltage takes three values, i.e. a plasma potential, 60V, and 100V. Mixed solution of sulfuric acid and hydrogen peroxide water at a mixed ratio of 6:1 is used. The time of cleaning with the foregoing mixed solution varies from 30 seconds to 10 minutes. When the accelerating voltage is over 60V, cleaning S25 with the foregoing mixed solution prior to anneal process S26 finds out almost no changes in the sheet resistance.

When the accelerating voltage is equal to the plasma potential, cleaning S25 finds out the sheet resistance decrease by 50% or more, because it seems that cleaning S25 washes away the boron introduced into silicon substrate 13.

Figure 8:
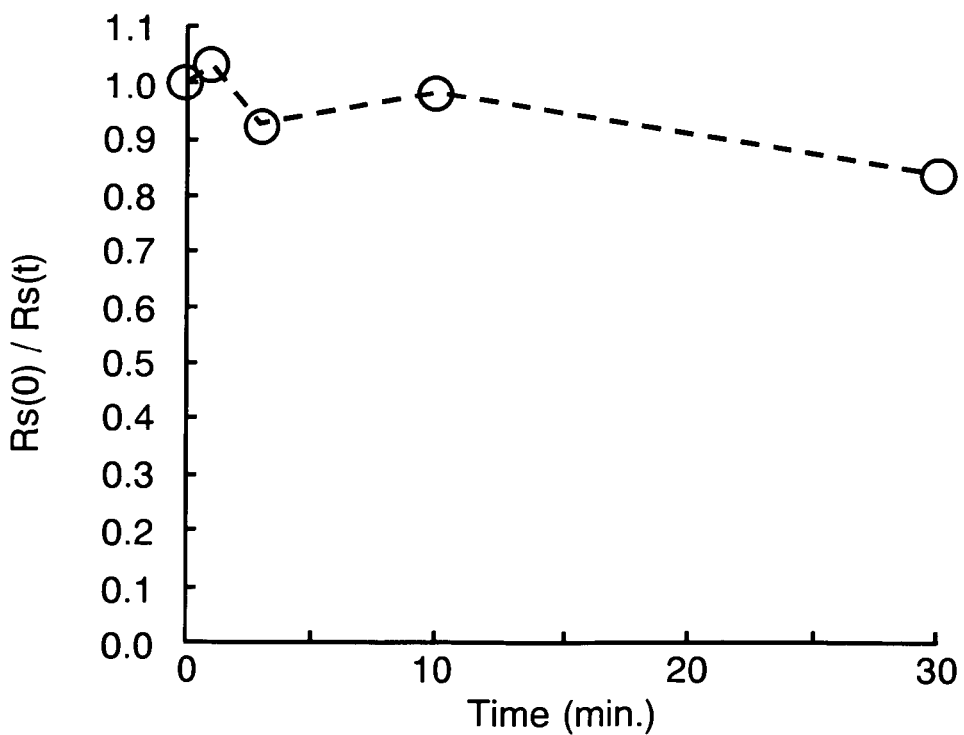
FIG. 8 illustrates influence of a cleaning time on a sheet resistance in accordance with an embodiment of the present invention.

FIG. 8 shows characteristics illustrating limitation of a cleaning time in accordance with an embodiment of the present invention. In the case of the accelerating voltage at 60V, the time of cleaning with the mixed solution of sulfuric acid and hydrogen peroxide water varies within 30 minutes, and a change of the sheet resistance is examined in those conditions. The cleaning time is preferably not longer than 20 minutes if a decrease of the sheet resistance needs to be not greater than 10% of the sheet resistance without the cleaning, and more preferably, it is not longer than 10 minutes, which ensures that the sheet resistance lowers by not greater than 10%. The cleaning time over 30 minutes is not preferable because it lowers the sheet resistance by greater than 10%.

Table 1 shows contamination on a principal face (surface) of silicon substrate 13 doped boron by a plasma doping apparatus. The contamination is measured by a frame-less atomic absorption method. The plasma doping apparatus includes a process chamber of which inner wall is coated with quartz by 52% area of the inner wall. The quartz-coated area is limited to plasma generating side partitioned by a plane of lower electrode 14, in other words, on the side of coil and antenna 3. Because silicon substrate 13 incurs more metal contamination from the inner wall on the plasma-generating side than the inner wall of a discharging section of the chamber. The quartz-coated area thus corresponds to 84% area of the plasma-generating side partitioned by the plane of lower electrode 14.

Plasma-doping is conducted in two levels, and two substrates are examined in each level. On each one of the two levels, a dose-quantity and a depth, at which depth a boron concentration as doped becomes 1E18 cm$^{-3}$, are changed by changing the doping conditions. The expression of "as doped" means "after impurity introduction" or "after particles introduction". This expression is used hereinafter and in table 1.

TABLE 1

| | 1E9 atoms/cm$^2$ | | | |
| --- | --- | --- | --- | --- |
| | 1E9 atoms/cm$^2$ | | | |
| | As-doped Boron 7.5E14 cm$^{-2}$ | | as-doped Boron 5.2E14 cm$^{-2}$ | |
| Sample | #1 | #2 | #1 | #2 |
| Fe | <2 | <2 | <2 | <2 |
| Cr | <2 | <2 | <2 | <2 |

TABLE 1-continued

| | 1E9 atoms/cm$^2$ | | | |
| --- | --- | --- | --- | --- |
| | 1E9 atoms/cm$^2$ | | | |
| | As-doped Boron 7.5E14 cm$^{-2}$ | | as-doped Boron 5.2E14 cm$^{-2}$ | |
| Sample | #1 | #2 | #1 | #2 |
| Ni | <4 | <4 | <4 | <4 |
| Cu | <2 | <2 | <2 | <2 |
| Na | <2 | <2 | 3 | <2 |
| Ca | <2 | <2 | 8 | <2 |
| K | 6 | <2 | 3 | <2 |
| Mg | 3 | 2 | <2 | <2 |
| Al | <6 | <6 | <6 | <6 |

Accelerating voltages of 60V, and 100V are used. Dose quantity of 7.5E14 cm$^{-2}$, and 5.2E14 cm$^{-2}$ are used corresponding to the foregoing two accelerating voltages. The depths where the boron concentration as doped becomes 1E18 cm$^{-3}$, are 7.4 nm and 10 nm correspondingly. As table 1 tells, those two cases proves that the contamination levels of Fe, Cr, Ni, Cu, Na, Ca, K, Mg, and Al are not higher than 1E10 atoms/cm$^2$. This is an excellent result, which allows reducing a load applied to the surface of a substrate in the step of cleaning in order to remove metal contamination. A process chamber is generally made of metal including aluminum. The contamination due to aluminum, in general, has a greater allowance level than other metals listed in table 1, so that a quartz-coated area is selected appropriately to a proper apparatus and process conditions in order to avoid an over-specification.

In an embodiment of the present invention, the quartz-coated inner wall is used in the process chamber; however, at least one of silicon, silicon nitride, nitride including a desirable impurity, and oxide or nitride including a desirable impurity can be used for coating the inner wall with a similar advantage. The nitride or oxide including a desirable impurity is, e.g. BN or $B_2O_3$ in the case of introducing boron. In the case of introducing arsenic, e.g. $As_2O_3$ or $As_2O_5$ is used for coating, and in the case of phosphorus, e.g. $P_4O_{10}$ is used for coating.

As discussed above, an embodiment of the present invention proves the following fact: An object (e.g. a semiconductor substrate such as a silicon substrate) to be processed is introduced particles, then the object undergoes the anneal process. At this time, the semiconductor substrate (silicon substrate) prior to the anneal process has a contamination level necessary for maintaining an yield rate of semiconductor devices built in the substrate, and yet, the substrate can be cleaned without decreasing the introduced particles.

Figure 9A:
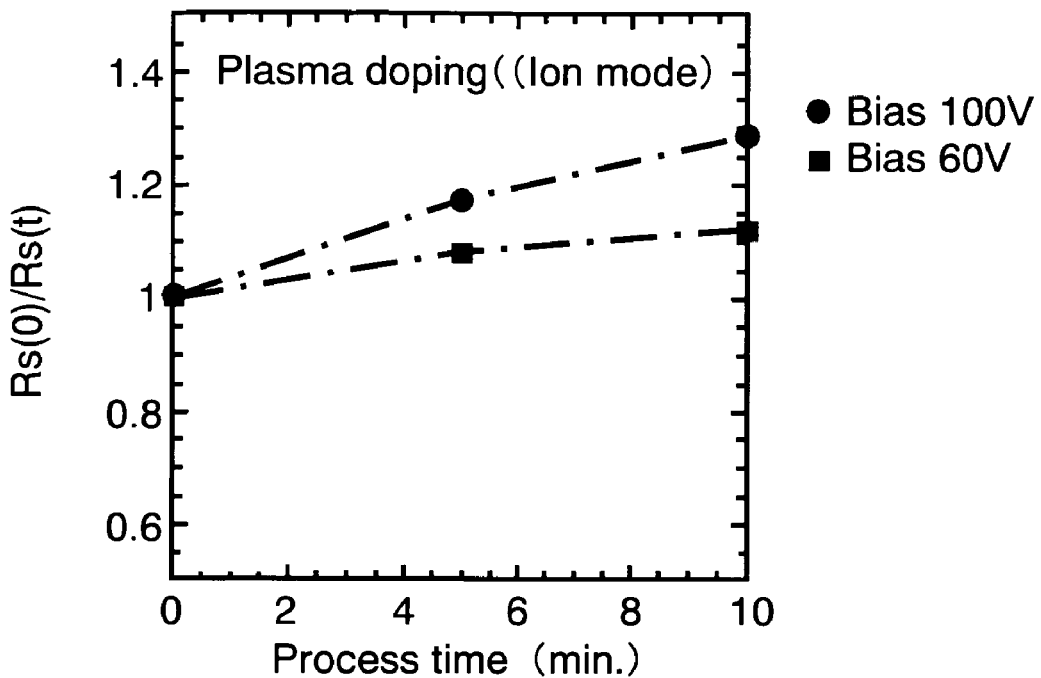
FIGS. 9A and 9B illustrates influence of a plasma doping method and a cleaning method on a sheet resistance in accordance with an embodiment of the present invention.
Figure 9B:
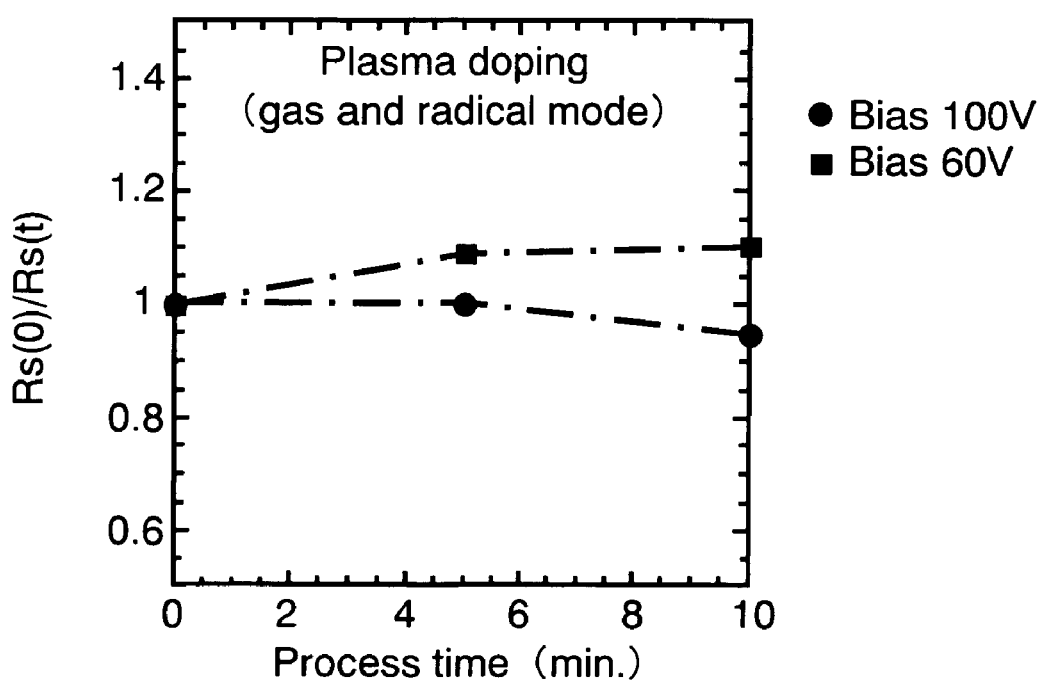

FIG. 9 shows characteristics illustrating the relations between plasma-doping methods and cleaning methods influencing on a sheet resistance in accordance with an embodiment of the present invention. The vertical axis represents a ratio of Rs (0) vs. Rs (t) which is a sheet resistance having undergone the anneal process following the cleaning with SPM. The horizontal axis represents a cleaning time with SPM.

The relations are detailed hereinafter with reference to the flowchart shown in FIG. 2. Plasma-doping S23 is conducted in the following three ways: Plasma-doping S23 in the typical ion mode S23a for 30 seconds; Plasma-doping S23 in the typical gas and radical mode S23b for 7 seconds; and Plasma-doping S23 in the typical gas and radical mode S23b for 7 seconds following the helium plasma irradiation and amorphization S22 at bias voltage of 100V for also 7 seconds.

At plasma-doping in ion mode S23a as well as in gas and radical mode S23b, two biased accelerating voltages are used, namely, 60V and 100V. Mixed solution of sulfuric acid and hydrogen peroxide water at the mixed ratio of 4:1 is used. Cleaning S25 is conducted at 80° C. for 5 minutes and 10 minutes independently. For the comparison purpose, a sheet resistance having undergone the anneal process skipping the step of cleaning is measured.

After the respective plasma-doping in three ways, the substrates are cleaned with mixed solution of sulfuric acid and hydrogen peroxide water prior to the anneal process, and the sheet resistance of each substrate does not increase by not smaller than 10%. Except the case of plasma-doping S23 in gas and radical mode S23b at biased voltage 100V, the other cases find out that the sheet resistance decreases through cleaning S25. In the case of plasma-doping S23 in the typical gas and radical mode S23b following the plasma irradiation and amorphization S22, the sheet resistance takes a medium value between the case of plasma-doping S23 in ion mode S23a and the case of plasma-doping S23 in gas and radical mode S23b.

Those facts are also observed in other embodiments detailed in this description. An advantage of lowering the sheet resistance through the cleaning is found in both the cases of plasma-doping S23 in ion mode S23a and plasma-doping S23 in gas and radical mode S23b following plasma irradiation and amorphization S22. It is obvious that this advantage can be seen in the case of plasma-doping S23 in ion mode S23a following plasma irradiation and amorphization S22 because of the examination on the boron densities at the utmost surface of silicon substrate 13 as well as the mechanism of introducing boron into silicon substrate 13.

Embodiment 1

Figure 10:
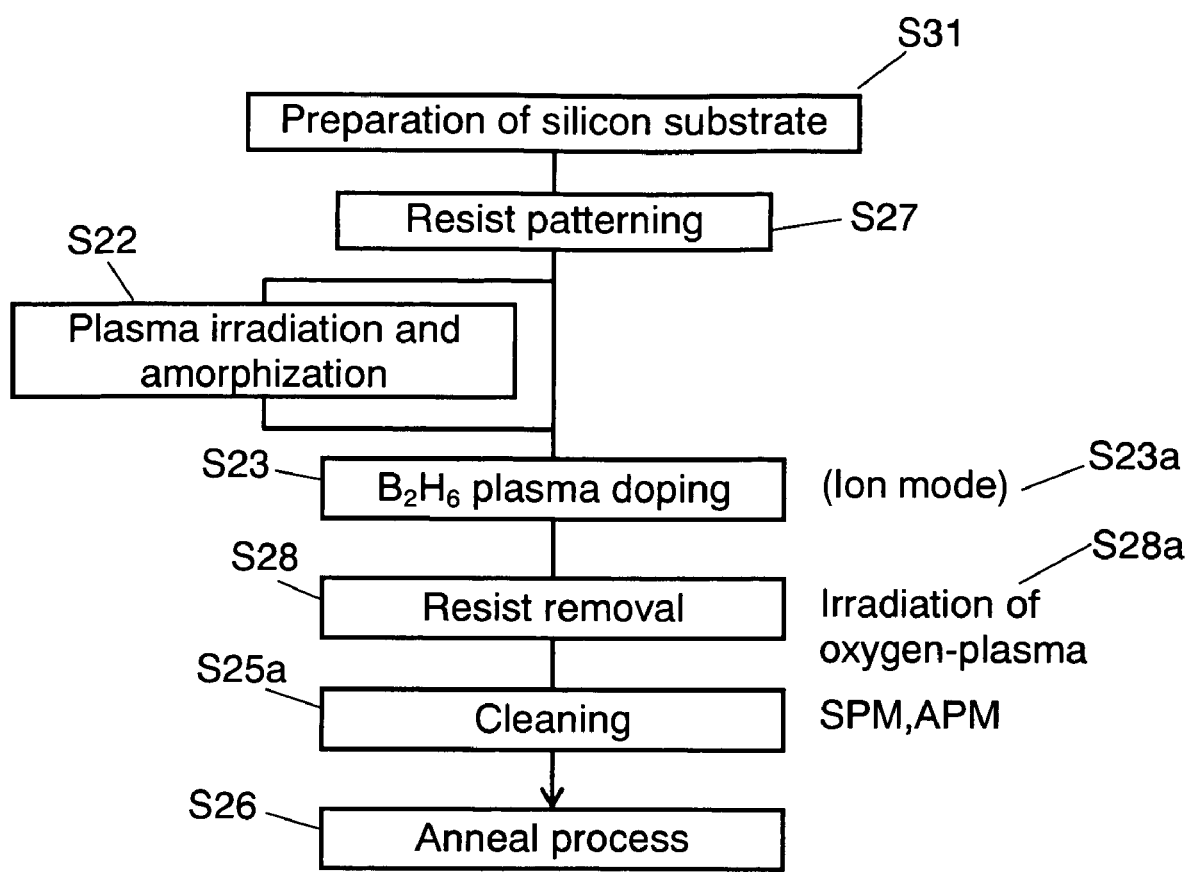
FIG. 10 shows a flowchart illustrating steps of manufacturing devices by using a method of cleaning a target in accordance with an embodiment of the present invention.
Figure 11A:
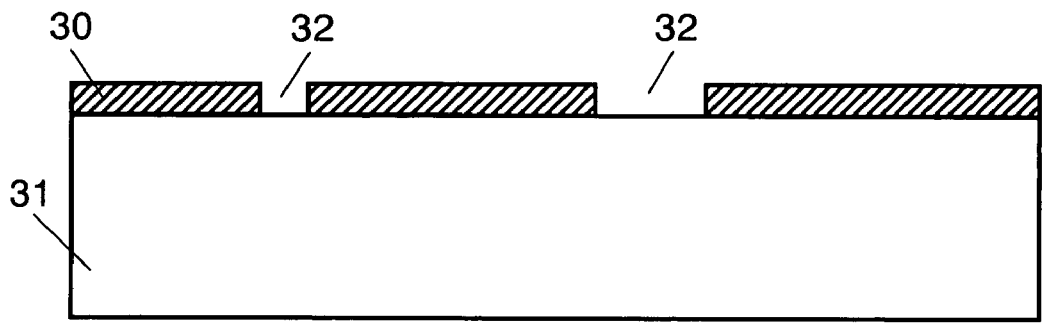
FIG. 11A-FIG. 11C schematically illustrate a sectional view of a device manufactured through the steps of the flowchart shown in FIG. 10.
Figure 11B:
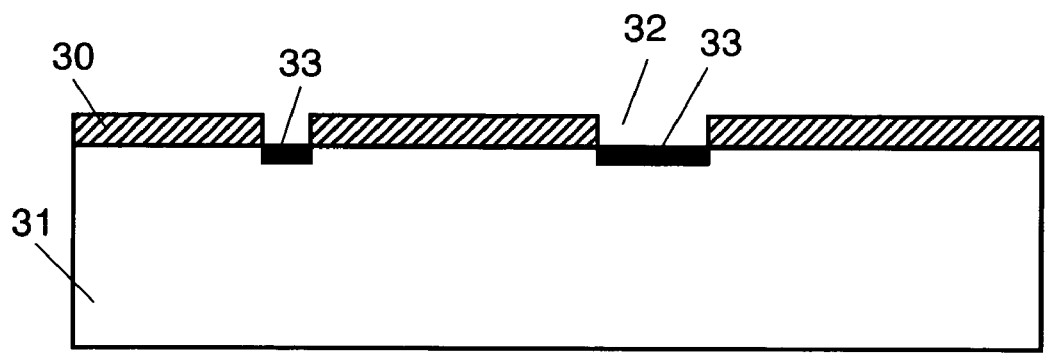
Figure 11C:
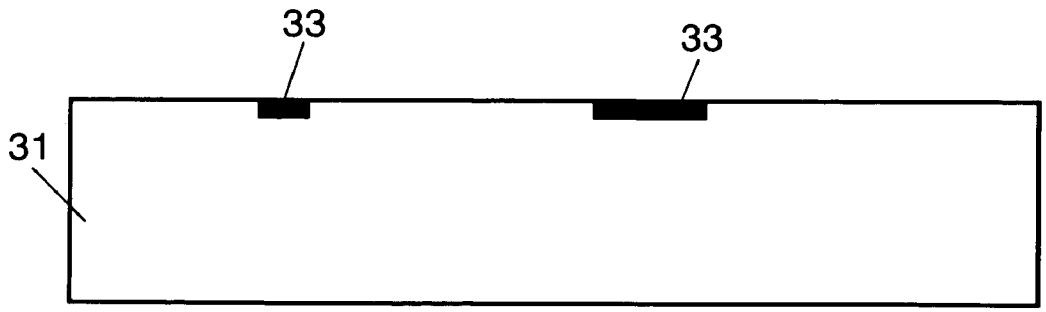

FIG. 10 shows a flowchart in accordance with the first embodiment of the present invention. FIG. 11A-FIG. 11C show a sectional view schematically illustrating an impurity-introduced layer which forms parts of a device, e.g. a transistor, built in silicon substrate 31, which is substantially the same as silicon substrate 13 used hitherto. The sectional views shown in FIG. 11A-FIG. 11C illustrate parts of electronic devices, i.e. structural elements such as diodes, resistors, capacitors or coils, schematically in a simple way.

The first embodiment is demonstrated hereinafter with reference to FIG. 10, FIG. 11A-FIG. 11C. As shown in FIG. 10, first, prepare silicon substrate 31, and form a resist on a principal face thereof, then conduct resist patterning S27 to etch a desirable resist pattern through a known etching process. FIG. 11A shows the completed state, namely, a given resist pattern 30 and opening 32 are formed on the principal face of substrate 31. Then plasma-doping S23 is carried out in the typical ion mode S23a using diborane ($B_2H_6$). Before this plasma-doping S23, plasma irradiation for amorphization using rare gas, hydrogen or mixed gas thereof can be done.

Opening 32 shown in FIG. 11A is exposed to the plasma used in the plasma irradiation and amorphization as well as the plasma used in the plasma-doping applied onto the principal face of substrate 31. The surface of substrate 31 is thus amorphized, and the boron is introduced to the principal face of substrate 31. Impurity-introduced layer 33 is thus formed as shown in FIG. 11B.

After plasma-doping S23, in resist removal S28, oxygen-plasma is irradiated onto the resist formed on the principal face of silicon substrate 31 for ashing, so that impurity-introduced layer 33 at opening 32 is exposed to the oxygen-plasma.

However, in the case of plasma-doping S23 in ion mode S23a as well as plasma-doping S23 in ion mode S23a following plasma irradiation and amorphization S22, boron does not diffuse outside silicon substrate 31 (out diffusion). Rather, the ashing can lower a rate of the boron lost to the outside of silicon, so that the sheet resistance can be lowered after the anneal process, and yet the resist can be removed.

After resist removal S28, impurity-introduced layer 33 which forms, e.g. a source or a drain of a transistor, appears on the principal face of substrate 31, as shown in FIG. 11C. Then the principal face is exposed to SPM or APM for cleaning, at this time, impurity-introduced layer 33 shown in FIG. 11C is also exposed to SPM or APM. When plasma-doping S23 in ion mode S23a is carried out and SPM is used, the boron does not decrease due to absorption or binding to others, or does not diffuse outward, rather the sheet resistance decreases, so that it is more preferable to use SPM. When plasma-doping S23 in ion mode S23a is carried out and APM is used, the boron hardly decreases due to absorption or binding to others, or hardly diffuses outward, so that use of APM is preferable.

In this embodiment 1, the processes of the flowchart shown in FIG. 10 can reduce the number of boron lost to the outside out of the boron introduced into silicon substrate 31. In other words, the sheet resistance having undergone the processes of the flowchart shown in FIG. 10 has a smaller resistance than the sheet resistance having skipped resist-patterning S27, resist removal S28 and cleaning S25a.

In other words, plasma-doping S23 in ion mode S23a finds out that a process-flow can have a greater degree of freedom in the steps of the resist removal and the cleaning. This first embodiment thus proves the following advantages: plasma-doping S23 introduces impurity to a desirable pattern formed by the resist, and a dose-loss of boron introduced can be reduced, so that the boron can be activated electrically through the steps of resist removal, cleaning and anneal process.

On top of that, as previously discussed, in the case of employing ion mode S23a, the resist removal using the ashing by oxygen-plasma can reduce the sheet resistance by a greater amount than a case where the ashing is not carried out. In the case of ion mode S23a, the ashing with SPM finds out a greater reduce in the sheet resistance.

Embodiment 2

Figure 12:
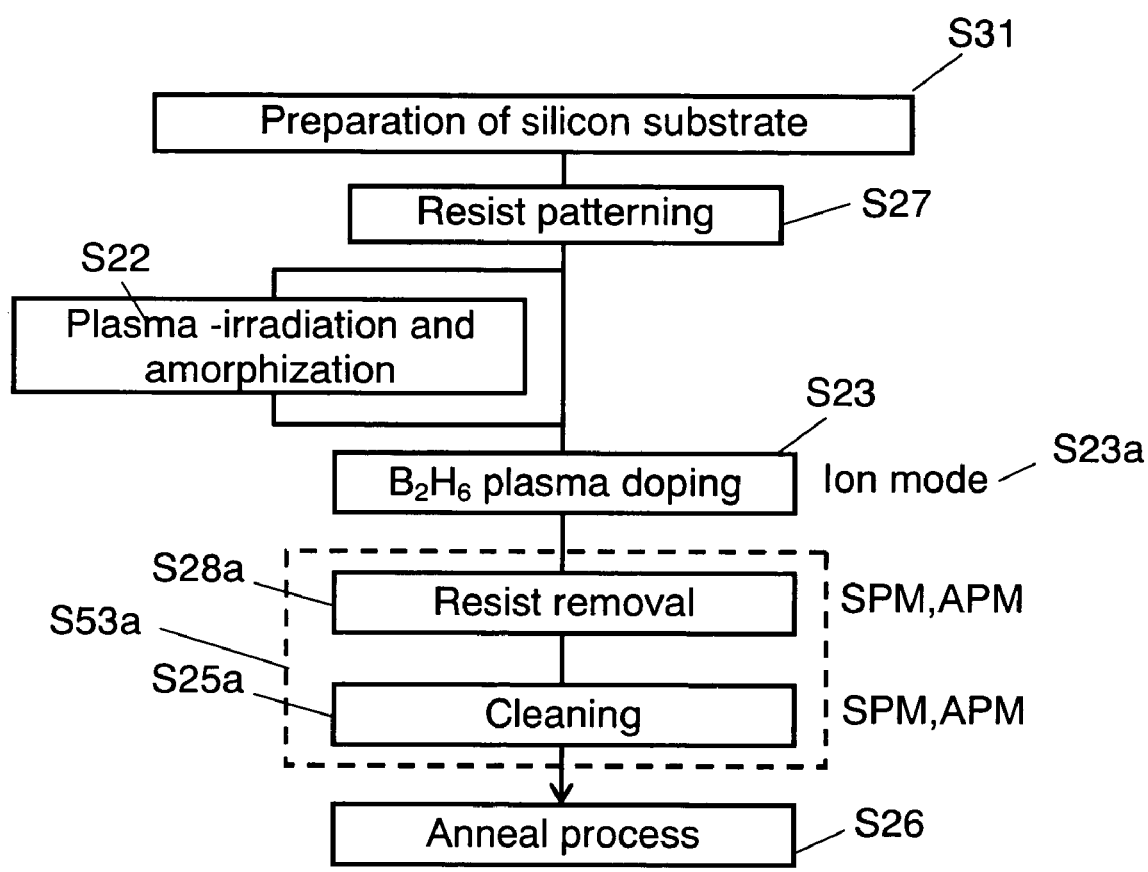
FIG. 12 shows a flowchart illustrating plasma doping in an ion mode in accordance with an embodiment of the present invention.

FIG. 12 shows a flowchart in accordance with the second embodiment of the present invention. The second embodiment differs from the first embodiment in resist removal S28a where SPM or APM are used. Other steps are similar to those of the first embodiment, so that the same reference marks are used.

The second embodiment is demonstrated hereinafter with reference to FIG. 10 and FIG. 12. A resist is formed on silicon substrate 31, and a desirable resist-patterning S27 is carried out, so that resist pattern 30 as well as opening 32 as shown in FIG. 11A is formed on a principal face of silicon substrate 31. Then plasma-doping S23 is carried out in the typical ion mode S23a. Before this plasma-doping S23, plasma irradiation for amorphization using rare gas, hydrogen or mixed gas thereof can be done. Opening 32 shown in FIG. 11A is exposed to the plasma used in the plasma irradiation and amorphization as well as the plasma used in the plasma-doping applied onto the principal face of substrate 31. The surface of substrate 31 is thus amorphized and the boron is introduced into the principal face of substrate 31, so that impurity-introduced layer 33 is formed as shown in FIG. 11B.

A feature of the second embodiment is touched previously, and now detailed here. As shown in FIG. 12, after plasma-doping S23, SPM or APM is brought into contact with the resist remaining on silicon substrate 31 in resist removal S28a for removing the resist. At this time, impurity-introduced layer 33 is exposed to SPM or APM through opening 32. As described previously, in the case of plasma-doping S23 in ion mode S23a and plasma-doping S23 in ion mode S23a following plasma-irradiation and amorphization S22, only a little amount of boron is removed outside substrate 31.

Use of SPM in resist removal S28a will reduce the sheet resistance after the anneal process and remove the resist because a rate of boron lost to the outside is lowered by cleaning substrate 31. Use of APM also finds out that the boron is lost to the outside of silicon substrate 31 at a small rate in both the cases of plasma-doping S23 in ion mode S23a and plasma-doping S23 in ion mode S23a following the plasma irradiation and amorphization S 22.

After resist removal S28a, impurity-introduced layer 33 is solely left on the principal face of silicon substrate 31 as shown in FIG. 11C. Then the surface of substrate 31 is cleaned with SPM or APM, so that impurity-introduced layer 33 shown in FIG. 11C is also exposed to SPM or APM.

When plasma-doping S23 in ion mode S23a is carried out and SPM is used, boron does not decrease due to absorption or binding to others, or not lost outward, rather the sheet resistance decreases, so that it is more preferable to use SPM. When plasma-doping S23 in ion mode S23a is carried out and APM is used, boron is hardly lost to the outside of silicon substrate 31, so that use of APM is preferable.

In the flowchart shown in FIG. 12, SPM is used at least in one of resist removal S28a or cleaning S25a, and APM is used in the remaining step where SPM is not used, then silicon substrate 31 having undergone the processes shown in FIG. 12 is put into anneal process S26. The result finds out that a smaller amount of boron is lost outside silicon substrate 31 out of the boron introduced by plasma-doping S23.

To be more specific, the sheet resistance having undergone the processes shown in FIG. 12 has a smaller resistance than the sheet resistance skipping resist-patterning S27, resist removal S28 and cleaning S25a. Use of AMP in either resist removal S28a or cleaning S25a finds out that the sheet resistance becomes similar to that of the case where resist-patterning S27, resist removal S28 and cleaning S25a are skipped out of the processes shown in FIG. 12. Use of the same solution in resist removal S28a and cleaning S25a can combine those two steps into one simultaneous step. The broken line indicated by reference mark S53a surrounds reference marks S28a and S25a for expressing this possible combination.

One of the methods of forming an impurity-introduced layer in accordance with embodiment 2 of the present invention employs the flowchart shown in FIG. 12. The processes shown in the flowchart allows removing the resist, leaving the boron in silicon substrate 31 or on the principal surface, on which electronic devices are formed, of substrate 31. In the case of plasma-doping S23 in ion mode S23a, use of SPM both in resist removal S28a and cleaning S25a will find out a greater amount of reduce in the sheet resistance. It is thus more preferable to use SPM.

Embodiment 3

Figure 13:
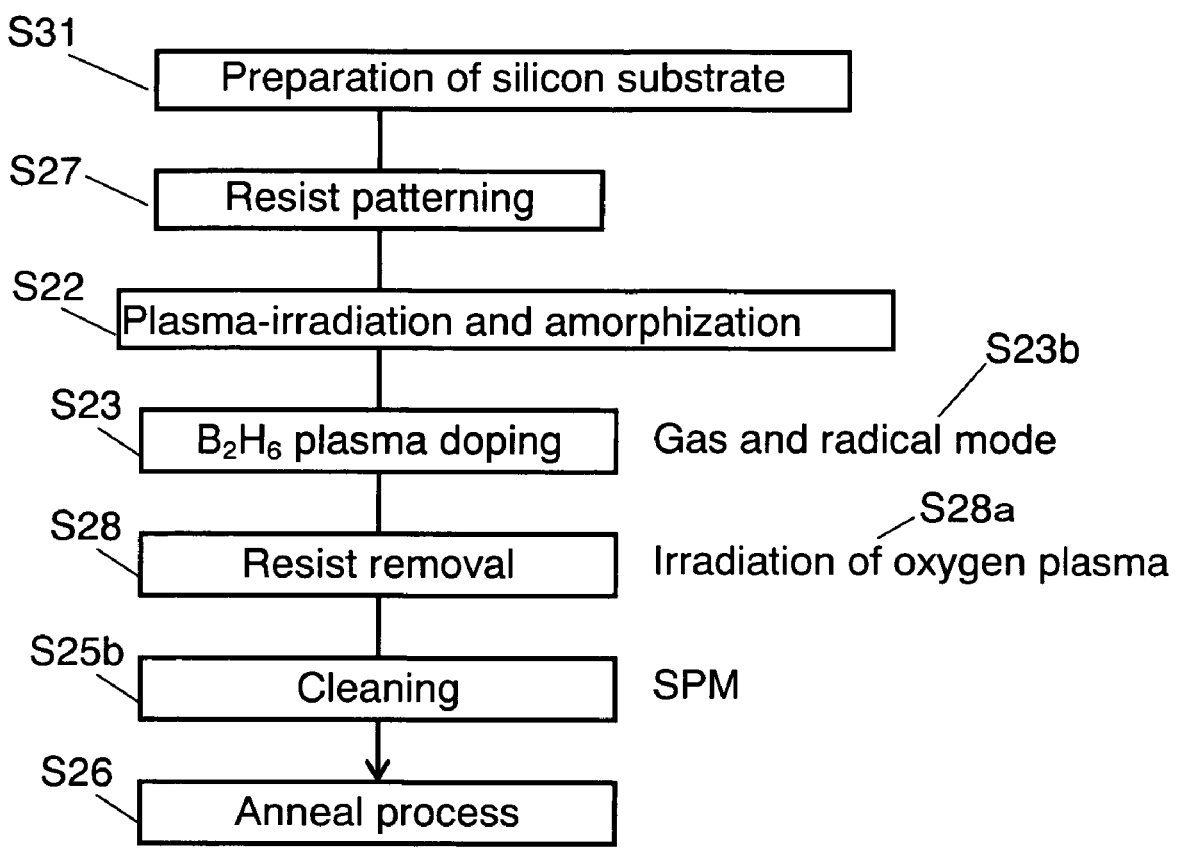
FIG. 13 shows a flowchart illustrating plasma doping in a gas and radical mode in accordance with an embodiment of the present invention.

FIG. 13 shows a flowchart in accordance with the third embodiment of the present invention. This flowchart differs from the one shown in FIG. 10 in gas and radical mode S23b and also a little bit in the cleaning step.

The third embodiment is demonstrated hereinafter with reference to FIG. 13 and FIG. 11. As described in the first and the second embodiments, first, form a resist on silicon substrate 31, and etch a desirable resist pattern. FIG. 11A shows this status. Then irradiate substrate 31 with plasma of rare gas or hydrogen, or mixed-gas of those two gases for amorphization S22 before plasma-doping S23 in the typical gas and radical mode S23b.

Through opening 32 of the resist shown in FIG. 11A, the principal face (surface) of silicon substrate 31 is exposed to the plasma used in plasma-irradiation and amorphization and the plasma used in plasma-doping S23. After the silicon is amorphized, boron is introduced and infiltrated into the silicon, so that impurity-introduced layer 33 is formed as shown in FIG. 11B.

In resist removal S28, the resist is exposed to oxygen-plasma for ashing, At this time, impurity-introduced layer 33 formed by the introduction through opening 32 shown in FIG. 11B is also exposed to the oxygen-plasma. In the case of plasma-doping S23 in gas and radical mode S23b following plasma-irradiation and amorphization S22, boron is not attached to the principal face of silicon substrate 31 but the boron tends to infiltrate inside substrate 31. Thus the boron on the principal face is not flown away due to the exposure to the oxygen-plasma, so that the boron hardly decreases due to absorption or binding to others or is lost outward.

Rather, the ashing can lower a rate of boron lost outside silicon substrate 31, so that the sheet resistance after anneal process S26 can be reduced and the resist can be removed.

After resist removal S28, substrate 31 becomes as shown in FIG. 11C. Then the principal face of substrate 31 is cleaned with SPM, at this time, impurity-introduced layer 33 is also exposed to SPM. When plasma-doping S23 in gas and radical mode S23b is carried out and SPM is used, boron does not decrease due to absorption or binding to others or is not lost outward, rather the sheet resistance decreases, so that it is more preferable to use SPM.

The sheet resistance having undergone the processes shown in FIG. 13 has a smaller resistance than the sheet resistance skipping resist-patterning S27, resist removal S28 and cleaning S25b. The processes of the flowchart shown in FIG. 13 allows removing the resist, leaving the boron in silicon substrate 31. In the case of plasma-doping S23 in gas and radical mode S23b, use of SPM allows maintaining the sheet resistance without increasing it. It is thus more preferable to use SPM.

Embodiment 4

Figure 14:
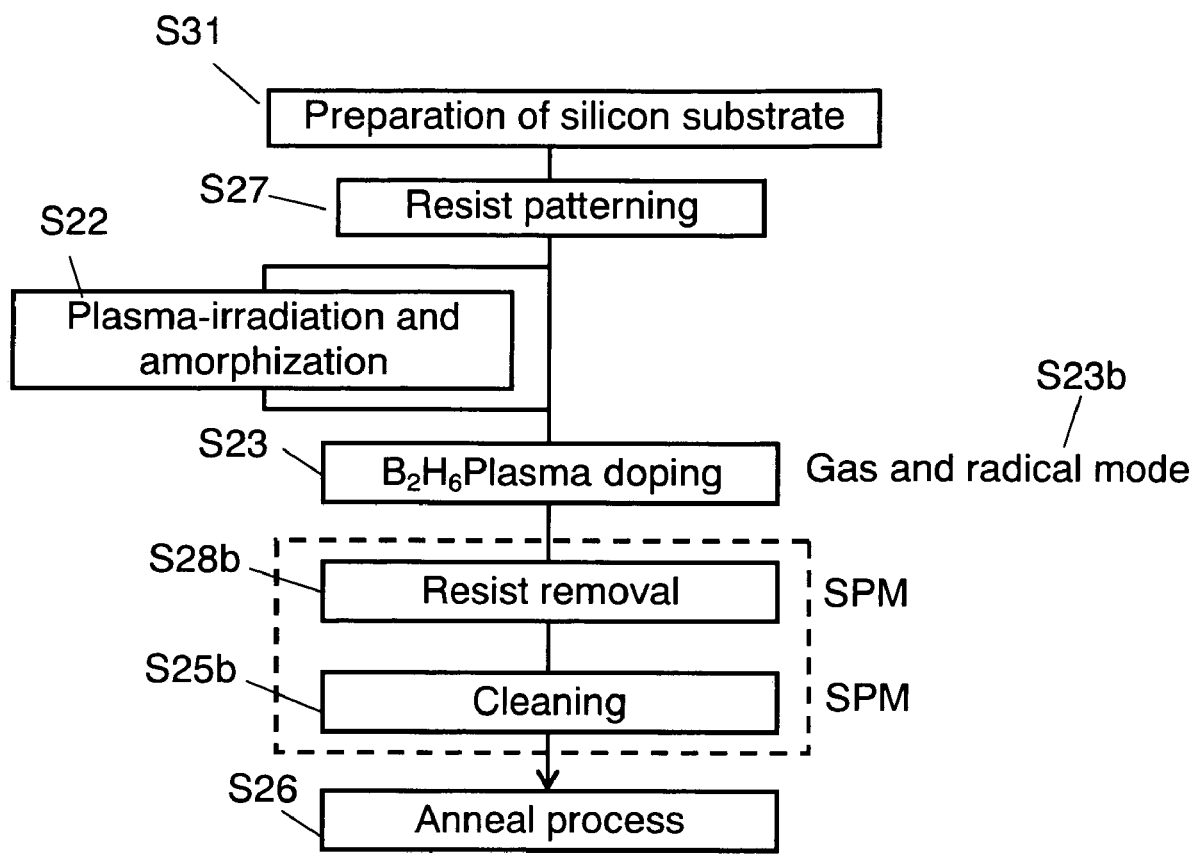
FIG. 14 shows a flowchart of the plasma doping in a gas and radical mode, resist removal, and cleaning with cleaning fluid of SPM ($H_2SO_4:H_2O_2=4:1$) in accordance with an embodiment of the present invention.

FIG. 14 shows another flowchart illustrating a method of forming an impurity-introduced layer of the present invention. FIG. 11A-FIG. 11C show an example of devices produced through the flowchart shown in FIG. 14. The fourth embodiment is demonstrated hereinafter with reference to FIG. 11A-FIG. 11C and FIG. 14.

As indicated by reference mark S31, first, prepare silicon substrate 31, then apply resist on a principal face of substrate 31, and provide substrate 31 with a given resist-patterning S27, thereby forming resist pattern 30 and opening 32. FIG. 11A shows this status.

Second, plasma-doping S23 in the typical gas and radical mode S23b is carried out. Before the plasma-doping, plasma-irradiation for amorphization S22 can be done onto substrate 31 by using rare gas or hydrogen, or mixed gas of the rare gas and hydrogen. Opening 32 of the resist shown in FIG. 11A is exposed to the plasma used in plasma-irradiation for amorphization and applied onto the principal face (surface) of silicon substrate 31 and the plasma used in plasma-doping S23. The principal face of the silicon is thus amorphized, and boron is introduced into the principal face of silicon substrate 31, so that impurity-introduced layer 33 is formed at opening 32 as shown in FIG. 11B.

After plasma-doping S23, resist removal S28b uses SPM for removing the resist. At this time, impurity-introduced layer 33 at opening 32 is exposed to SPM. In the case of plasma-doping S23 in gas and radical mode S23b or the same plasma-doping following plasma-irradiation and amorphization S22, only a little part of the boron is lost due to absorption or binding to others or diffusion to the outside of substrate 31. In other words, use of SPM lowers a rate of boron lost outside substrate 31 through cleaning S25b, so that the sheet resistance after the anneal process can be reduced and the resist can be removed.

After resist removal S28b, substrate 31 becomes as shown in FIG. 11C. Then the principal face of substrate 31 undergoes cleaning S25b using SPM, at this time, impurity-introduced layer 33 is also exposed to SPM. When plasma-doping S23 in gas and radical mode S23b is carried out and SPM is used, only a little amount of the boron is lost due to absorption or binding to others or diffusion to the outside of substrate 31, so that it is more preferable to use SPM.

The sheet resistance having undergone the processes shown in the flowchart in FIG. 14 is similar to the case where resist-patterning S27, resist removal S28b and cleaning S25b are skipped among the processes shown in FIG. 12. The processes of the flowchart shown in FIG. 14 allows removing the resist, leaving the boron in silicon substrate 31. Use of the same solution in resist removal S28b and cleaning S25b can combine those two steps into one simultaneous step.

Embodiment 5

Figure 15:
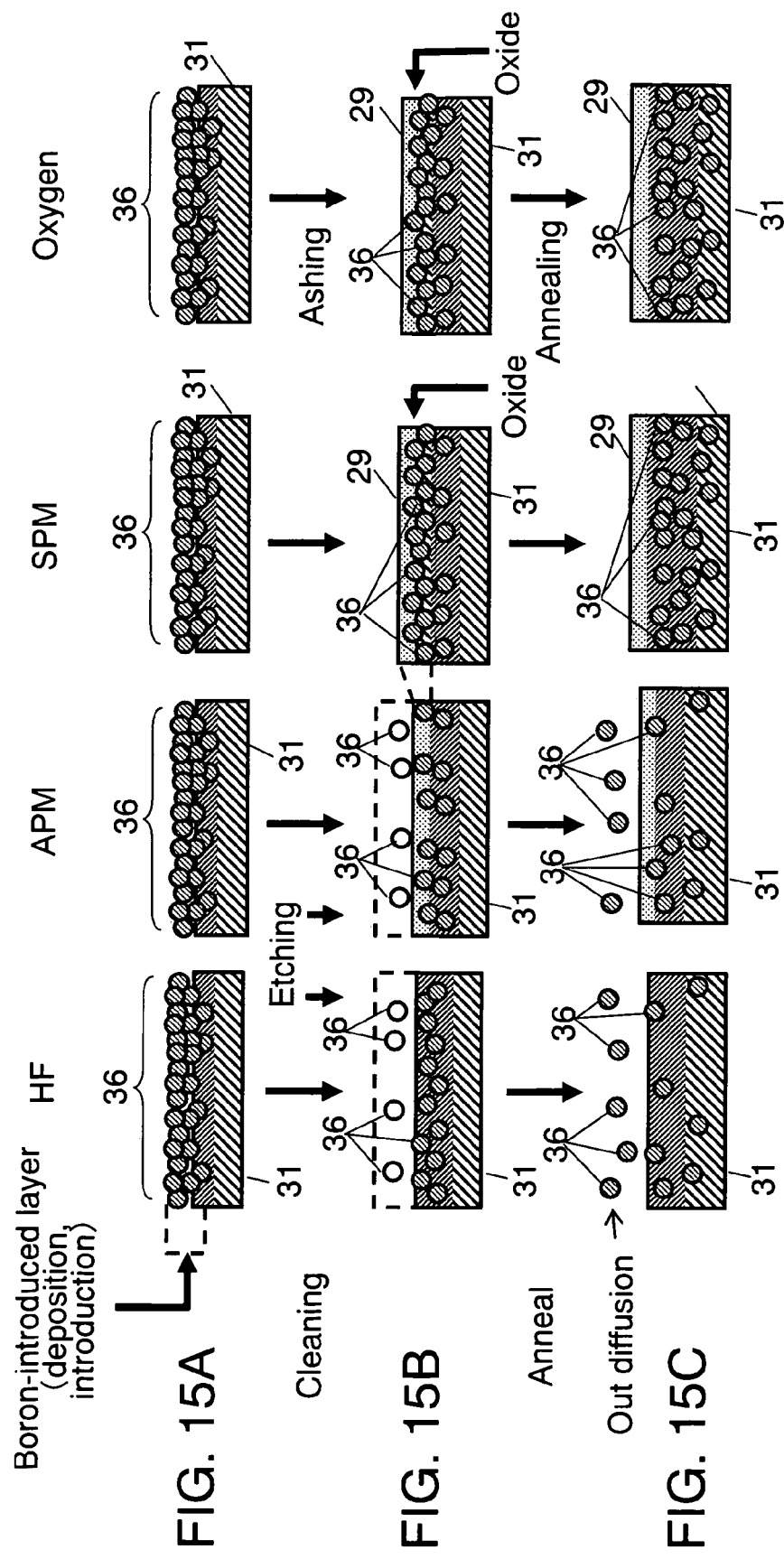
FIG. 15A-FIG. 15C illustrate a mechanism that avoids removing but leaves an impurity layer (a layer where boron is introduced) introduced by plasma-doping in a silicon substrate.

FIG. 15A-FIG. 15C illustrate a mechanism of the boron introduced into silicon substrate 31 by plasma-doping S23, the mechanism tells that the boron then undergoes the ashing with oxygen-plasma as well as the cleaning with SPM, and yet, the boron still remains in the silicon without being removed even after the anneal process.

FIG. 15A schematically illustrate the status immediately after when boron 36 is introduced into the principal face of silicon substrate 31 by deposition, plasma-doping or ion implantation. FIG. 15B schematically illustrates the status immediately after cleaning S25b, e.g. shown in FIG. 14 is carried out. FIG. 15C schematically illustrates the behavior of the boron immediately after anneal process S26, e.g. shown in FIG. 14. The columns of SPM and oxygen-plasma in FIGS. 15A-15C show the process in the embodiments, and those of HF and APM show the process in comparative instances. APM used in plasma-doping S23 in ion mode S23a indicates that the case represents the embodiment.

The fifth embodiment finds out the following new fact: After plasma-doping S23, cleaning S25b with SPM or an ashing with oxygen-plasma is conducted before anneal process S26. This process results in a reduce in dose-loss of the boron introduced by plasma-doping S23. SPM cleaning S25b and the ashing with oxygen-plasma oxidize the principal face of silicon substrate 31 and form oxide layer 29 on the surface of the impurity introduced layer. Boron 36 attached to or deposited on the surface of the impurity-introduced layer is not flown away outside substrate 31 but boron 36 is taken into oxide layer 29.

Refer to FIG. 15A-FIG. 15C again. SPM and oxygen-plasma can take boron 36 attached to the principal face of substrate 31 or introduced into substrate 31 into oxide layer 29 formed by SPM and oxygen-plasma, and they prevent boron 36 from being lost due to out diffusion to the outside of substrate 31. On the other hand, HF and APM etch silicon substrate 31 in the step of cleaning, and wash away boron 36 attached to the principal face of substrate 31. APM forms oxide layer 29 simultaneously, so that APM contributes to the dose-loss at a medium magnitude between HF and SPM.

Figure 16:
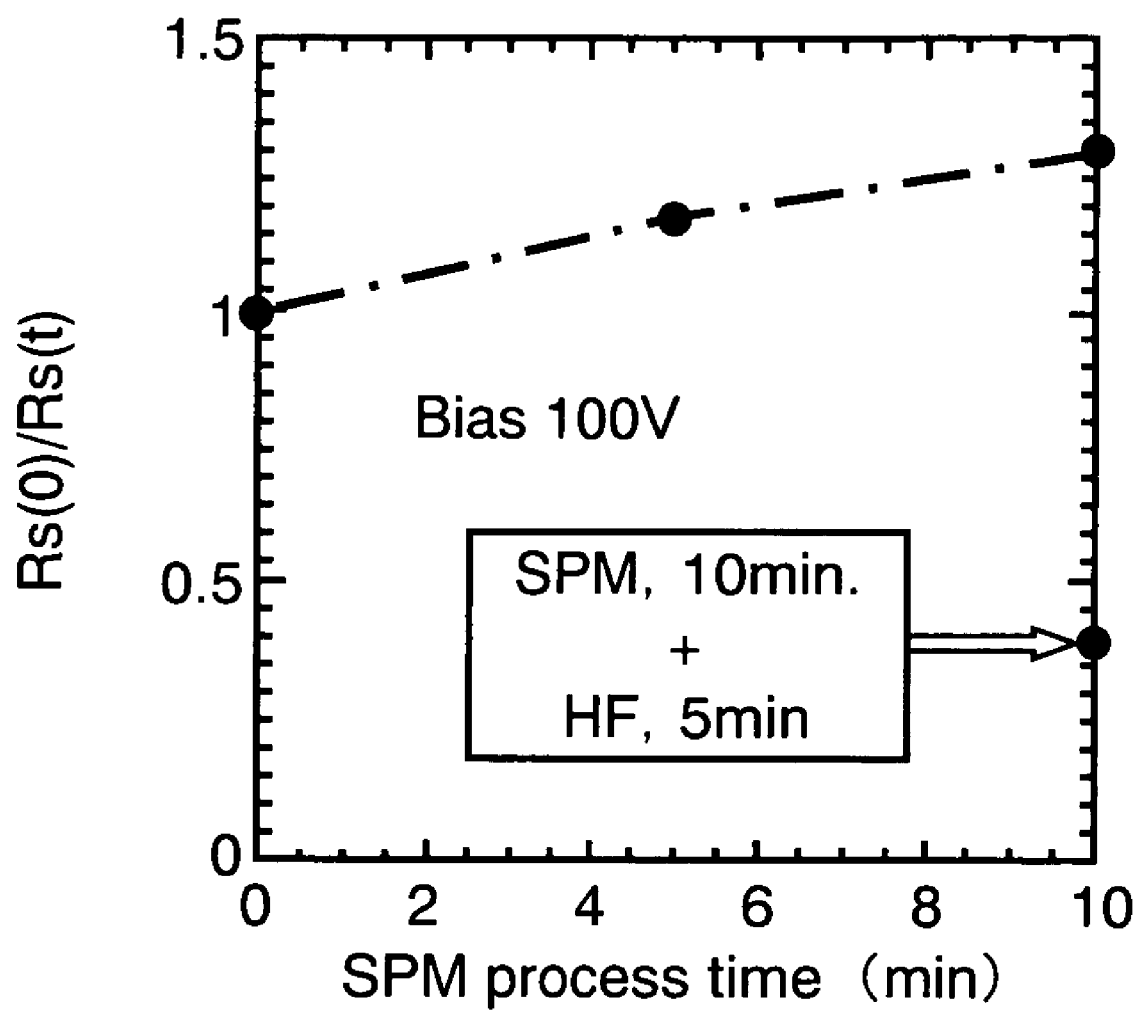
FIG. 16 illustrates influence of the cleaning fluid employing SPM on a sheet resistance in accordance with an embodiment of the present invention, and comparative influence of hydrogen fluoride brought into contact with a surface of a silicon substrate after SPM cleaning.

FIG. 16 illustrates the result of the foregoing mechanism. Plasma-doping S23 in the typical ion mode S23a is conducted at 100V bias voltage, then substrate 31 is cleaned with SPM ($H_2SO_4:H_2O_2$=4:1, 80° C.) for 10 minutes followed by a cleaning for 5 minutes with HF diluted with extra-pure water into 1% concentration. Anneal process S26 is then done with a halogen lamp at 1100° C. for 3 minutes, and the sheet resistance is measured. Silicon substrate 31 having undergone SPM cleaning S25b and anneal process S26 skipping an HF cleaning finds out a far smaller amount of reduce in the sheet resistance than substrate 31 having undergone the foregoing steps including the HF cleaning.

The reason of the difference in the reduction is this: After SPM cleaning S25b, boron 36 taken into oxide layer 29 shown in FIG. 15A-FIG. 15C is removed by the HF cleaning. In the case of plasma-doping S23 followed by SPM cleaning S25b and then anneal process S26 in accordance with an embodiment of the present invention, boron 36 is protected by oxide layer 29 and is not lost by absorption to or binding to others or out diffusion. As a result, the sheet resistance lowers in a greater amount than that of the case where SPM cleaning S25b is not conducted.

The fifth embodiment thus finds out a way to minimize the dose-loss of boron 36 introduced into silicon substrate 31 throughout the steps of the ashing, the cleaning and the anneal process. The way is this: after plasma-doping S23, it is effective to form oxide layer 29 on the principal face of substrate 31 prior to anneal process 26. There are several methods to form oxide layer 29; irradiation of oxygen-plasma; bring SPM solution into contact with silicon substrate 31; putting an oxide layer through CVD; and putting an oxide layer by ion-plating.

Embodiment 6

FIG. 17 shows characteristics illustrating variations of a sheet resistance with respect to a cleaning time. (133) In this sixth embodiment, influence of APM cleaning on a dose-loss of boron is described.

After plasma-doping S23, silicon substrate 13 (31) is taken out from process chamber 15. Plasma-doping S23 is conducted in two ways, namely, in the typical ion mode S23a and in the typical gas and radical mode S23b. A bias voltage employs 60V or 100V. Silicon substrate 13 having undergone plasma-doping S23 undergoes APM cleaning S25a, where APM employs mixed solution of $NH_4OH$, $H_2O_2$ and $H_2O$ at 1:1:5, then rinsed with extra-pure water and dried. For a comparison purpose, substrate 13 is directly carried to an anneal process skipping an AMP cleaning. The anneal process is done with a halogen lamp at 1100° C. for 3 minutes.

Figure 17A:
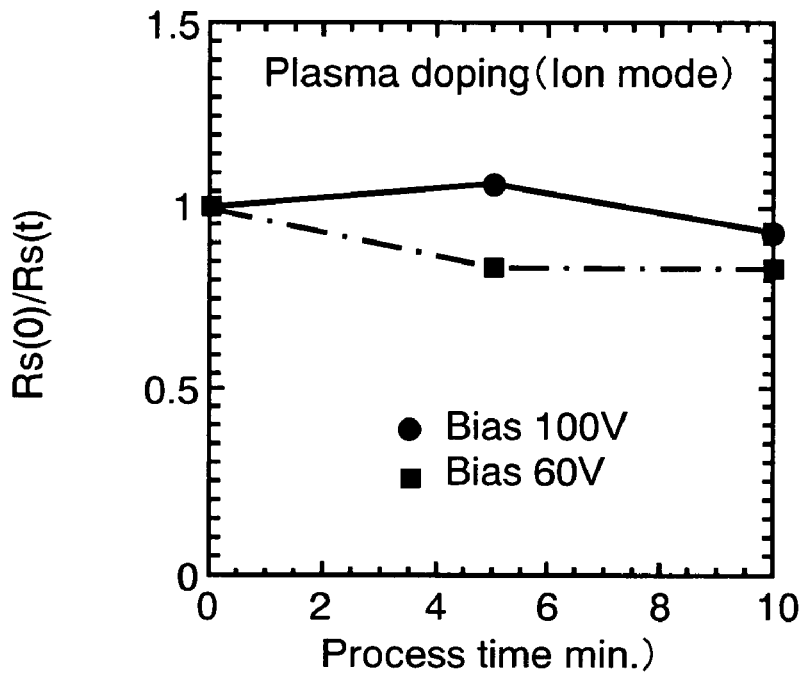
FIG. 17A-FIG. 17B show characteristics illustrating influence of cleaning fluid employing APM on a sheet resistance in accordance with an embodiment of the present invention.
Figure 17B:
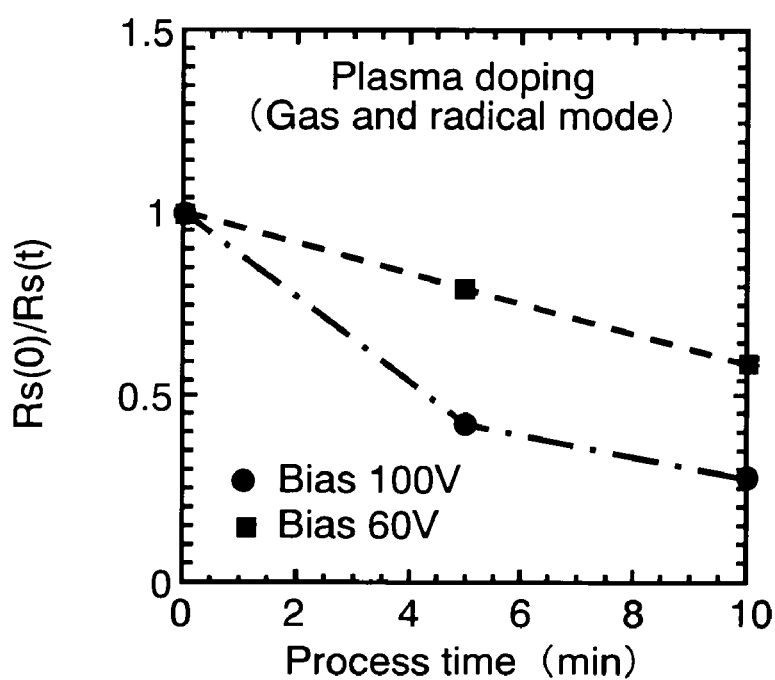

FIGS. 17A and 17B show characteristics illustrating variations of a sheet resistance with respect to a cleaning time using APM. FIG. 17A shows the case where boron is introduced by plasma-doping S23 in the typical ion mode S23a, and FIG. 17B shows the case where boron is introduced by plasma-doping S23 in the typical gas and radical mode S23b. The vertical axis represents a ratio of sheet resistance Rs (0)

of a silicon substrate introduced boron by plasma-doping S23 followed by the anneal process vs. sheet resistance Rs (t) having undergone the APM cleaning followed by the anneal process. The horizontal axis represents an AMP cleaning time of the respective substrates, and the time varies in the range of not longer than 10 minutes.

In the case of plasma-doping S23 in ion mode S23a, the APM cleaning invites a small dose-loss of boron because an amount of boron 36 attached to the principal face of silicon substrate 31 is substantially smaller than the total amount of boron 36 introduced in silicon substrate 31. The comparison experiment, where substrate 31 undergoes the APM cleaning after plasma-doping S23 in gas and radical mode S23b, finds out a greater dose-loss of boron and a substantial reduce in the sheet resistance.

(A Difference Between Ion-Mode S23a and Gas and Radical Mode S23b)

A difference between ion-mode S23a and gas and radical mode S23b is further detailed hereinafter. In ion mode S23a, plasma of $B_2H_6$ gas extremely diluted by helium gas is used. In gas and radical mode, plasma of $B_2H_6$ gas at a high concentration is used. In ion mode S23a, doping boron 36 simultaneously invites amorphization, so that boron in gas and radical does not attach to the principal face of silicon substrate 31 but infiltrates into substrate 31. In gas and radical mode S23b, the amorphization does not proceed well, so that boron tends to attach to the principal face of substrate 31. The difference between ion-mode S23a and gas and radical mode S23b can be distinguished by comparing optical absorption coefficients of amorphous layers of the principal faces of silicon substrates 31 having undergone respective plasma-doping S23 in the two modes. This is detailed below.

In vacuum chamber 15 shown in FIG. 1, silicon substrate 13 (31) as an object to be processed is irradiated with plasma supplied from a helicon-wave plasma source. Mixed gas of helium gas and diborane gas is used, and a mixed ratio is varied within the range from helium gas concentration at 95% vs. diborane gas concentration at 5% to helium gas concentration at 99.975% vs. diborane gas concentration at 0.025%.

First, irradiate silicon substrate 13 (31) with plasma in the following conditions: source power=1500 W, pressure=0.9 Pa, irradiation time=7 seconds, and bias voltage=60V Then stop the plasma irradiation, suck the inside of chamber 15 into vacuum condition, purge chamber 15 with nitride gas, and take out substrate 13 (31) from chamber 15.

All the samples are measured through the ellipsometry about a thickness of their amorphous layers and an optical absorption coefficient with respect to the light having a wavelength of 530 nm. Further, dose amounts of boron of respective samples are measured with SIMS.

Figure 18:
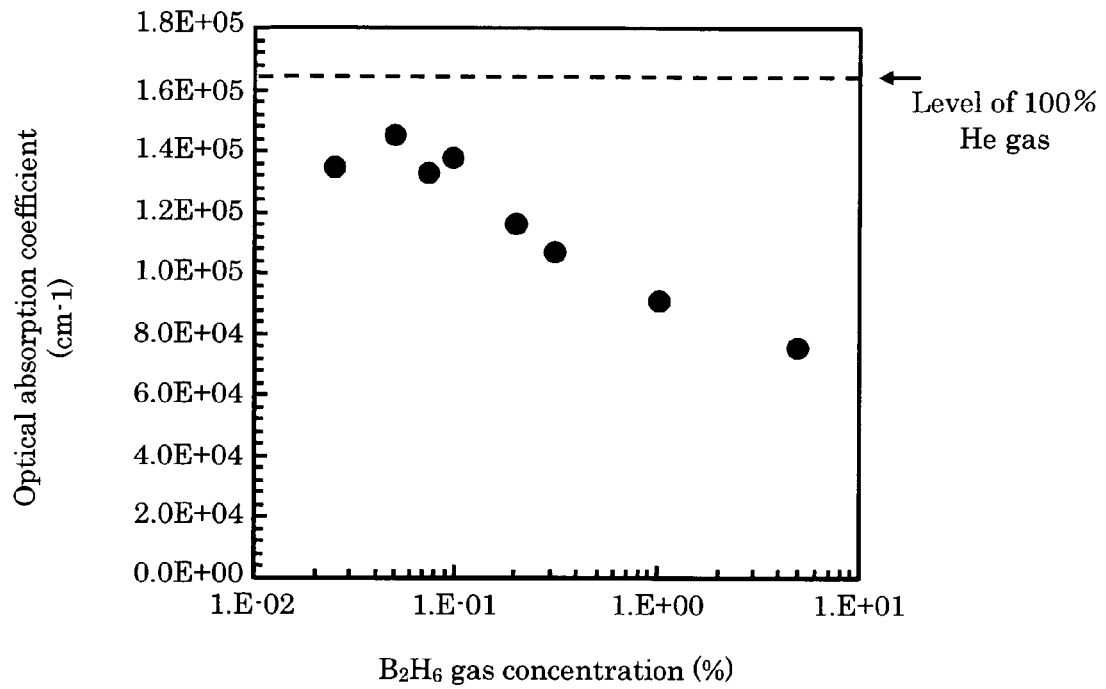
FIG. 18 shows a relation between a gas concentration of diborane ($B_2H_6$) in accordance with an embodiment of the present invention and an optical absorption coefficient of a silicon surface with respect to the light having 530 nm wavelength.

FIG. 18 shows a relation between $B_2H_6$ gas concentration and optical absorption coefficient of the surface of silicon substrate 31 with respect to the light having a wavelength of 530 nm. The $B_2H_6$ gas concentration is varied by changing a portion of $B_2H_6$ gas in mixed $B_2H_6$ gas. The optical absorption coefficient takes the maximum value at the amorphization by plasma-irradiation using helium gas only.

The optical absorption coefficient does not change so much within the range from $B_2H_6$ gas concentration vs. He gas concentration=0.025%/99.975% to 0.1%/99.9%; however, when $B_2H_6$ gas concentration is increased from 0.1% and onward, the optical absorption coefficient lowers as the gas concentration increases. For instance, the optical absorption coefficient of an amorphous layer produced at $B_2H_6$ gas concentration/He gas concentration=5%/95% is at 55% of the one produced at $B_2H_6$ gas concentration/He gas concentration=0.1%/99.9%, so that the coefficient lowers to as low as 46% of the one produced at He gas concentration is 100%. Yet, in the case of plasma-doping at $B_2H_6$ gas concentration/ He gas concentration=5%/95%, the amorphous layer has an optical absorption coefficient 6.3 times that formed of c-Si (single crystal silicon).

Figure 19:
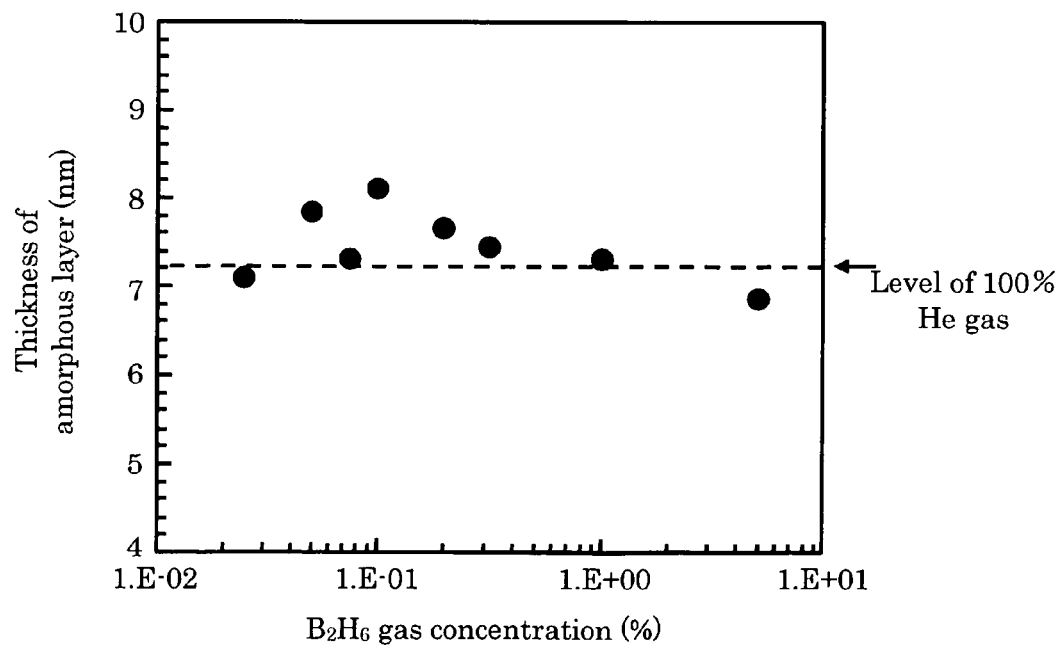
FIG. 19 shows a thickness of an amorphous layer in response to the changes of gas concentration of diborane ($B_2H_6$) in accordance with an embodiment of the present invention.

FIG. 19 shows changes in thickness of the amorphous layer by plasma-doping in response to the changes of the $B_2H_6$ gas concentration/He gas concentration. FIG. 19 basically tells that the amorphous layer is formed such that the layer has the same thickness as the one amorphized by the plasma of He 100%.

In more details, the thickest amorphous layer is formed at the gas concentration of 0.1%/99.9%, and the thickness decreases at the lower or higher gas concentration than 0.1%/ 99.9%. To be more specific, when both of the amorphization and the plasma-doping are desirably conducted, the $B_2H_6$ gas concentration/He gas concentration desirably ranges from 0.05%/99.95% to 0.1%/99.9%.

An increase in $B_2H_6$ gas concentration from 0.1% and onward lowers the optical absorption coefficient although the amorphous layer maintains its thickness, because a content of amorphous lowers, namely, a lower concentration of $B_2H_6$ gas and a higher concentration of He gas make crystals fall in pieces more easily. It is thus preferable that the $B_2H_6$ gas concentration is not greater than 0.1% and the He gas concentration is not smaller than 99.9% in order to form an amorphous layer having a higher optical absorption coefficient.

The amorphous layer having a higher optical absorption coefficient contains amorphous at a higher content, so that boron of gas and radical more easily infiltrates into the amorphous layer. An amorphous layer having a low optical absorption coefficient contains amorphous at a not sufficient content and the amorphous is rather like crystalline silicon, so that the boron does not infiltrate into the layer so easily, and boron attaches to the surface at a higher rate.

In the case of plasma-doping S23 in the typical ion mode S23a, the $B_2H_6$ gas concentration is 0.025%, and the optical absorption coefficient with respect to light of 530 nm wavelength is $1.35E5$ cm$^{-1}$ as shown in FIG. 18. A concentration of $B_2H_6$ gas lower than 0.025% does not lower the coefficient from $1.35E5$ cm$^{-1}$, but does not increase the coefficient over $1.5E5$ cm$^{-1}$.

In the case of plasma-doping S23 in the typical gas and radical mode S23b, the $B_2H_6$ gas concentration is 5%, which is higher by 200 times than that of the typical ion mode S23a. As shown in FIG. 18, the concentration of $B_2H_6$ gas increases from 0.1% and onward to approximate to that of the gas and radical mode, so that the optical absorption coefficient lowers. When the concentration of $B_2H_6$ gas reaches to 5%, the coefficient lowers to $7.5E4$ cm$^{-1}$.

In the case of the typical gas and radical mode S23b previously discussed, high-frequency power supply 1 reduces its source power down to 1000V, and the pressure increases up to 2.5 Pa. However, when plasma-doping S23 in the typical gas and radical mode S23b is conducted for 7 seconds at bias voltage of 60V, the optical absorption coefficient is $8.4E4$ cm$^{-1}$, which is the same level as the coefficient when $B_2H_6$ gas concentration is 5%. A concentration of $B_2H_6$ gas higher than 5% does not lower the coefficient substantially, i.e. lowers to $6E4$ cm$^{-1}$, where the lowering is saturated.

As discussed above, this sixth embodiment proves that a boundary between ion mode S23a and gas and radical mode S23b exists between the optical absorption coefficients at $1.3E5$ cm$^{-1}$ and at $6E4$ cm$^{-1}$ with respect to the light having 530 nm wavelength. Since the optical absorption coefficient varies sequentially in response to the changes of the $B_2H_6$ gas concentration, the boundary exists at the $B_2H_6$ gas concentration, which makes the coefficient stand at a medium value between $1.3E5$ cm$^{-1}$ and $6E4$ cm$^{-1}$, namely at $9.5E4$ cm$^{-1}$. This $B_2H_6$ gas concentration can be read as 0.7% in FIG. 18. To be more specific, when the $B_2H_6$ gas concentration becomes not higher than 0.7%, ion mode S23*a* takes place, and when the $B_2H_6$ gas concentration becomes higher than 0.7%, gas and radical mode S23*b* takes place.

Embodiment 7

Figure 20:
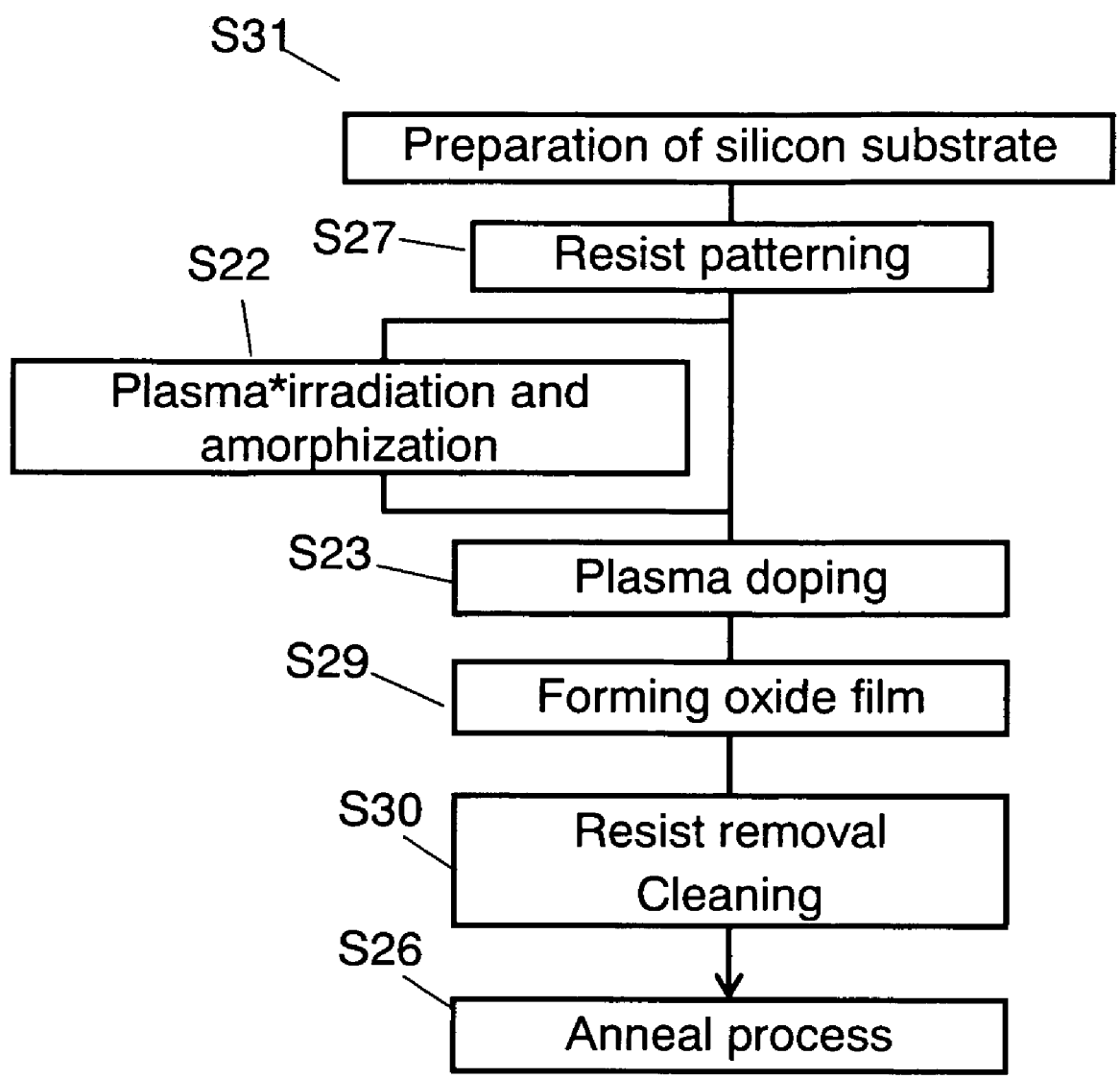
FIG. 20 shows a flowchart of forming an oxide layer before the cleaning step in accordance with an embodiment of the present invention.

FIG. 20 shows a flowchart in accordance with the seventh embodiment, which differs from other embodiments in having a step of forming oxide layer S29 following plasma-doping S23. The other steps are similar to those of the other embodiments. A protective film, i.e. oxide layer 29 should be formed between the steps of the impurity introduction and the anneal process in order to prevent the impurity from escaping silicon substrate 31 to the outside. This important matter of the present invention is previously described.

FIG. 20 should be read this way: after oxide layer formation S29, a step or plural steps selected from the steps consisting of the resist removal and cleaning S30 is to be carried out. Oxide-layer formation S29 can be done simultaneously with the step or the plural steps selected from the steps consisting of the resist removal and cleaning S30. The oxide layer can be put by CVD or ion-plating. Then anneal process S26 is conducted. This flowchart can reduce a dose-loss of boron 36 introduced by plasma-doping S23.

Other steps, e.g. preparation S31 of silicon substrate 31, resist-patterning S27, and anneal process S26 are the same as those of other embodiments, so that detailed descriptions thereof are omitted here.

Embodiment 8

Figure 21:
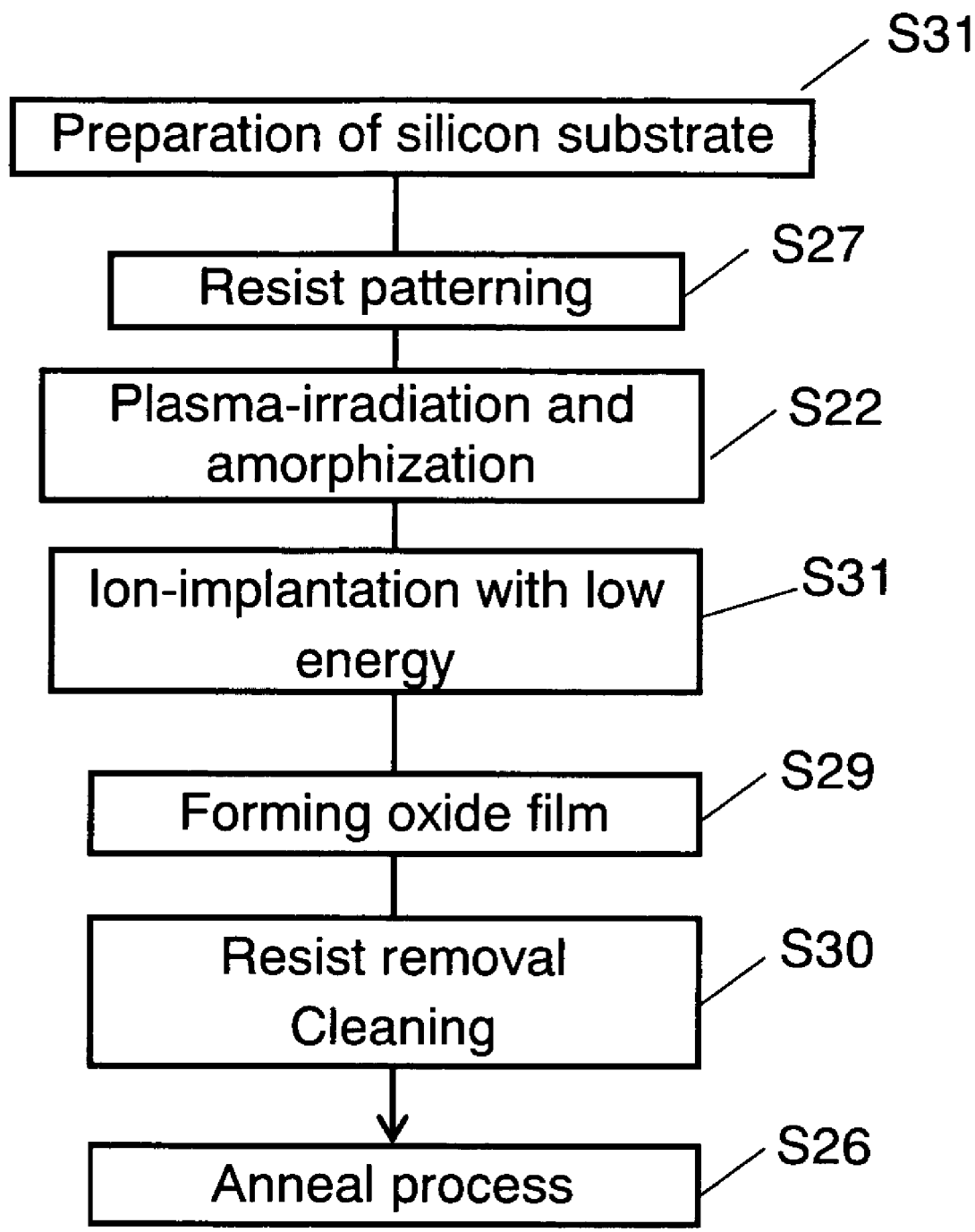
FIG. 21 shows a flowchart of amorphization and forming an oxide layer in accordance with an embodiment of the present invention.

FIG. 21 shows a flowchart in accordance with the eighth embodiment, in which a low-energy ion-implantation or a gas-doping can be employed for introducing impurity. Before the impurity introduction, plasma irradiation and amorphization S22 is conducted. In the case of selecting the low-energy ion implantation, plasma-irradiation and amorphization S22 can reduce channeling effect, so that boron can introduced at a shallower depth. This method is thus preferable.

In the case of selecting the gas-doping, plasma-irradiation and amorphization S22 can infiltrate the boron contained in the gas into silicon substrate 31 with ease, so that this method is preferable. The gas-doping is one of the methods of introducing impurity, and the gas-doping is conducted in this way: irradiate silicon substrate 13 (31) with plasma for amorphization in process chamber 15, then stop the plasma-irradiation, and introduce the gas containing boron, such as diborane gas, into process chamber 15. This method uses a phenomenon that gas infiltrates into an amorphous layer, so that the impurity introduction with ultra-low energy is achievable.

FIG. 21 tells that after preparation of silicon substrate 31 (S31), resist-patterning S27 is conducted, then substrate 31 undergoes plasma-irradiation and amorphization S22, so that a principal face of substrate 31 exposed from opening 32 is amorphized. Those steps are similar to those of other embodiments. Then a method selected from the low-energy ion implantation and the gas-doping is used for introducing impurity into silicon substrate 31.

Oxide layer formation S29 is carried out thereafter. After this step, a step selected from the resist removal and cleaning S32, or a plurality of the steps are conducted. Oxide layer formation S29 can be done simultaneously with the selected step or the plurality of the steps. Then anneal process S26 is conducted. The foregoing series of steps can reduce a dose-loss of the boron introduced with the low-energy.

Methods or Cases Producing an Advantage Similar to the Foregoing Ones

Amorphization S22 prior to the plasma-doping in every embodiment can be done by ion implantation instead of plasma-irradiation. This is already described previously. For instance, ions such as Ge or Si can be implanted for amorphization, or ions of rare gas can be implanted. Further, use of ion-shower can expect an advantage similar to what is discussed above. In the case of the ion shower, an apparatus, which comprises a plasma generating chamber, a mesh, and a table on which a silicon substrate is placed, is used. The mesh is placed between plasma and a silicon substrate, and a desirable electric potential is applied to the mesh. This method allows irradiating the silicon substrate with plasma at its surface via the mesh with the desirable electric potential applying, so that a dispersed ion irradiation called the ion-shower is conducted, thereby amorphizing substrate 31 efficiently. This method does not need mass segregation, so that an amount of ion-beam current irradiated to the surface of the silicon substrate is smaller than that of the plasma-doping which directly exposes the substrate to plasma; however, the amount of ion-beam current is incomparably greater than that of the ion-implantation. Light elements having a comparatively smaller atomic weight can be used efficiently for amorphization, for instance, possibility of amorphization using helium or hydrogen having the lightest atomic weight can be expected.

FIGS. 7, 8, 9A, 9B, 16, 17A, 17B, 22A and 22B show the result of anneal process with a halogen lamp at 1100° C. for 3 minutes. Use of spike RTA at 1075° C. produces a result similar to that of the anneal process at 1100° C. for 3 minutes regarding a rate of dose-loss.

In every embodiment previously demonstrated, plasma-doping S23 in ion mode S23*a* can be replaced with the ion-shower with the same advantage maintained. This ion shower is basically the same one as used in the amorphization demonstrated previously; however, it differs from the one in the plasma containing particles of desirable impurity. To be more specific, the plasma containing desirable impurity such as boron is irradiated to the surface of the silicon substrate via the mesh, so that the ion including desirable particles is irradiated. Since the ion undergoes no mass-segregation, an amount of ion-beam current including desirable particles irradiated to a solid substrate is smaller than that of the plasma-doping which exposes the solid substrate directly to plasma; however it is far greater than that of the ion implantation. The impurity can be thus introduced efficiently. According to the principle of impurity introduction with the ion-shower, it can be expected that the ion-shower method produces an advantage similar to that of plasma-doping S23 in ion mode S23*a* which introduces mainly ion with low energy.

The ion implantation at the low energy includes ion-implantation using gas cluster ion-beam or molecular ion-beam. The ion implantation using the gas cluster ion is conducted this way: gas cluster formed of argon and boron moderately bound to each other and having a great mass is produced from mixed gas of, e.g. argon gas and $B_2H_6$ gas. The gas cluster thus produced is ionized, and then accelerated and transported by an electromagnetic field before being irradiated to a silicon substrate. The moderate binding of the gas cluster gets loose and comes apart on the surface of the silicon substrate, and the accelerating energy is distributed to each molecule of the gas cluster.

An accelerating energy allotted to one unit of boron becomes thus very small. For instance, when gas cluster including "n" units of argon and "m" units of boron is ionized monovalent, then accelerated by 10 keV, one unit of boron has an accelerating energy of 10/(n+m) keV. In the case of n=100 and m=2, the accelerating energy of one unit of boron becomes as low as approx. 100 eV.

Ion implantation using a molecular ion beam is conducted this way: for instance, $B_{10}H_x+$, which is an ion of decaborane, is accelerated, and the molecules come apart on the surface of the silicon substrate, so that an accelerating energy allotted to one boron becomes thus small. For instance, in the case of using 5 kV for accelerating, one boron is introduced by an energy as low as 500 eV.

As discussed above, the ion implantation using the gas cluster ion beam or the molecular ion beam gives cluster ions or molecular ions rather high energy in a unit of over kV; however, a desirable particle such as boron practically has a small amount of energy, so that the ion implantation is done at a shallow depth. One of the foregoing methods of ion implantation is conducted using low energy so that ion can be implanted at a depth not deeper than 15 nm, more particularly, not deeper than 10 nm, then the atomic concentration of the particles becomes 1E18 atoms/cm$^3$ before the anneal process. In this case, the problem discussed in the present invention is revealed as it appears in the case of the boron in a drift mode; however, it can be expected that this embodiment overcomes the problem.

Comparative Case

After plasma doping S23, silicon substrate 13 (31) is taken out from process chamber 15. Plasma doping S23 is conducted in either one of two ways, namely, in the typical ion mode S23a or in the typical gas and radical mode S23b. After plasma doping S23, silicon substrate 13 (31) undergoes an HF cleaning with hydrogen fluoride of 1% concentration at an ambient temperature. Then substrate 13 (31) is rinsed with extra-pure water and dried. For a comparison purpose, a silicon substrate skipping the HF cleaning undergoes an anneal process using a halogen lamp at 1100° C. for 3 minutes.

Figure 22A:
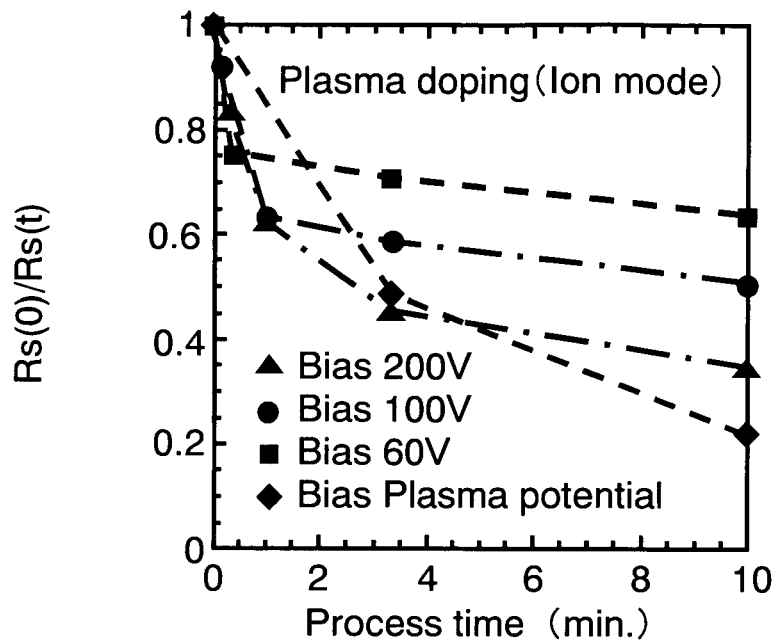
FIG. 22A-FIG. 22B show variations of a cleaning time and a sheet resistance depending on plasma doping in an ion mode with hydrogen fluoride (HF) and in a gas and radical mode respectively for comparing with those of an embodiment of the present invention.
Figure 22B:
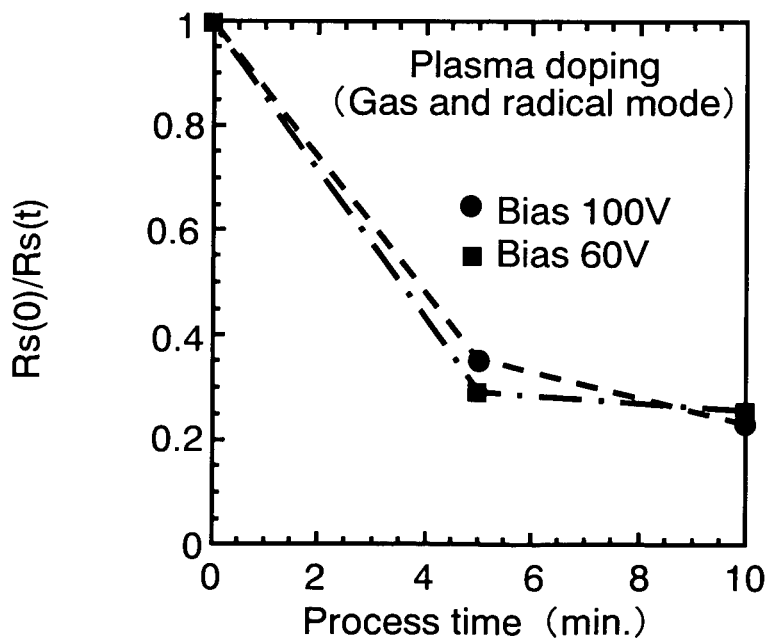

FIGS. 22A and 22B show the relation between a cleaning time using HF and a sheet resistance. FIG. 22A shows a case where boron is introduced by plasma-doping S23 in the typical ion mode S23a, and FIG. 22B shows the case where boron is introduced by plasma-doping S23 in the typical gas and radical mode S23b. The vertical axis represents a ratio of sheet resistance Rs (0) of silicon substrate 13 (31) introduced boron by plasma-doping S23 followed by the anneal process vs. sheet resistance Rs (t) having undergone the HF cleaning followed by the anneal process. The horizontal axis represents the HF cleaning time which varies in the range of not longer than 10 minutes. HF of 1% concentration is used, and a biased accelerating voltage takes four values, i.e. a plasma potential, 60V, 100V, and 200V.

As FIGS. 22A and 22B clearly tell, the value of Rs (0)/Rs (t) is lowered by the cleaning and is independent of an accelerating voltage applied at the doping. In other words, the sheet resistance rises after the cleaning. Because the cleaning washes away the dopant (impurity) from silicon substrate 31. The rise of the sheet resistance is observed even in a short-time washing within 5 minutes. Those facts tell that a problem of a conventional cleaning which includes the HF cleaning is caused by a rise of the sheet resistance. It has been thus difficult to use the conventional cleaning in a mass production of substrates into which dopant is introduced by the plasma-doping, ion-implantation with low energy, deposition on a surface of the substrates, or introduction of dopant at a shallow depth.

INDUSTRIAL APPLICABILITY

The present invention as discussed above can provide a cleaning method which can clean a silicon substrate prior to an anneal process and after an introduction of dopant particles. The cleaning method cleans the substrate at a level necessary for maintaining an yield rate of semiconductor devices built-in the silicon substrate, and yet, the method does not reduce the introduced particles in this cleaning step. The silicon substrate, i.e. a solid substrate, into which dopant (impurity) is introduced by plasma-doping, ion-implantation with low energy, deposition on the surface of the substrate, or dopant introduction at a shallow depth of the substrate.

On top of that, the present invention provides a method of introducing impurity to a desirable place of a principal face of the solid substrate through forming a resist pattern, and yet, this method does not reduce the introduced particles in this step of introducing impurity.

The present invention can be used in the process of manufacturing semi-conductors or liquid crystal, such as in the step of cleaning the substrate, into which particles have been introduced through plasma-doping, ion-implantation, or deposition. The present invention can be also used in a method of introducing impurity, the method including the resist removal, and the invention can be used in an apparatus for introducing the impurity. The present invention can be employed in a method of manufacturing devices such as resistors, coils and capacitors. The present invention thus can be highly evaluated in the industrial application.

The invention claimed is:

1. A method of forming an impurity introducing layer, comprising the steps of:
   (a) forming a resist pattern on a semiconductor substrate;
   (b) amorphousizing a surface of the semiconductor substrate after step (a);
   (c) introducing impurities to the semiconductor substrate by a plasma doping using a gas containing the impurities and using the resist pattern as a mask;
   (d) removing the resist pattern after step (c);
   (e) cleaning the semiconductor substrate after step (d); and
   (f) heating the semiconductor substrate to activate the impurities after step (e).

2. The method according to claim 1, wherein the gas containing the impurities is one of a hydrogen compound gas containing boron, a fluoride gas containing boron, and a chloride gas containing boron.

3. The method according to claim 1, wherein a depth at which the atomic concentration of the impurities in the semiconductor substrate is $1 \times 10^{18}$ atoms/cm$^2$ before the heat treatment is 15 nm or less.

4. The method of according to claim 1, wherein a pressure of the plasma doping is in the range of 0.9 to 2.5 Pa.

5. The method according to claim 1, further comprising the step of (f) forming an oxidation film on the semiconductor substrate to which the impurities are introduced, after step (c) and before (e).

6. The method according to claim 1, wherein the resist pattern is removed and an oxidation film is formed on the semiconductor layer to which the impurities are introduced in step (e).

7. The method according to claim 1, wherein step (d) is performed by using an oxygenic plasma.

8. The method according to claim 1, wherein step (d) is performed by using a solution in which sulphuric acid and hydrogen peroxide are mixed.

9. The method according to claim 1, wherein the heat treatment is performed by using a halogen lamp.

10. The method according to claim 1, wherein step (d) is performed by using one of a solution in which sulphuric acid and hydrogen peroxide are mixed and a solution in which $NH_4OH$, $H_2O_2$, and $H_2O$ are mixed.

11. The method according to claim 1, wherein step (e) is performed by using one of a solution in which sulphuric acid and hydrogen peroxide are mixed and a solution in which $NH_4OH$, $H_2O_2$, and $H_2O$ are mixed.

12. The method according to claim 1, wherein steps (d) and (e) are performed together by using one of a solution in which sulphuric acid and hydrogen peroxide are mixed and a solution in which $NH_4OH$, $H_2O_2$, and $H_2O$ are mixed.

13. The method according to claim 1, wherein step (d) is performed by using an oxygenic plasma and the step (e) is performed by using one of a solution in which sulphuric acid and hydrogen peroxide are mixed and a solution in which $NH_4OH$, $H_2O_2$, and $H_2O$ are mixed.

14. The method according to claim 1, wherein step (d) is performed by oxygen plasma.

15. The method according to claim 1, wherein the step (c) is performed at the same time as the step (b).

16. The method according to claim 1, wherein the gas containing the impurities is a mixture gas of $B_2H_6$ and He.

17. The method according to claim 16, wherein a concentration of the $B_2H_6$ is in the range of 0.025 to 5%.

18. The method according to claim 1, wherein the heat treatment is performed by using a spike RTA.

19. The method according to claim 1, wherein the step (c) is performed after the step (b).

20. The method according to claim 19, wherein the step (b) is performed by using a plasma irradiation.

21. The method layer according to claim 1, wherein the plasma doping is an ion-mode plasma doping.

22. The method according to claim 21, wherein the surface of the semiconductor substrate is made amorphous by the ion-mode plasma doping in step (c).

23. The method according to claim 21, wherein the gas containing the impurities is a mixture gas of $B_2H_6$ and He, and a concentration of the $B_2H_6$ is 0.7% or less.

24. The method according to claim 22, wherein the gas containing the impurities is a mixture gas of $B_2H_6$ and He, and a concentration of the $B_2H_6$ is in the range of 0.05 to 0.1%.

* * * * *